US009691650B2

(12) United States Patent
Kurita et al.

(10) Patent No.: US 9,691,650 B2
(45) Date of Patent: *Jun. 27, 2017

(54) SUBSTRATE TRANSFER ROBOT WITH CHAMBER AND SUBSTRATE MONITORING CAPABILITY

(75) Inventors: Shinichi Kurita, San Jose, CA (US); Takayuki Matsumoto, San Jose, CA (US); Suhail Anwar, San Jose, CA (US); Makoto Inagawa, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1260 days.

This patent is subject to a terminal disclaimer.

(21) Appl. No.: 12/890,281

(22) Filed: Sep. 24, 2010

(65) Prior Publication Data

US 2011/0076118 A1    Mar. 31, 2011

Related U.S. Application Data

(60) Provisional application No. 61/246,906, filed on Sep. 29, 2009.

(51) Int. Cl.
*H01L 21/677* (2006.01)
*H01L 21/67* (2006.01)

(52) U.S. Cl.
CPC .. *H01L 21/67742* (2013.01); *H01L 21/67259* (2013.01)

(58) Field of Classification Search
CPC .................................. H01L 21/67706
USPC ...................................... 414/744.3
See application file for complete search history.

(56) References Cited

U.S. PATENT DOCUMENTS

| 2,993,675 | A |   | 7/1961  | Tatter |
|-----------|---|---|---------|--------|
| 3,901,356 | A |   | 8/1975  | Butler |
| 4,187,051 | A | * | 2/1980  | Kirsch et al. ............... 414/744.3 |
| 4,577,821 | A |   | 3/1986  | Edmo et al. |
| 4,744,712 | A |   | 5/1988  | Mitchell |
| 5,131,501 | A |   | 7/1992  | Yoshikawa et al. |
| 5,393,931 | A | * | 2/1995  | Guenther ...................... 174/547 |
| 5,394,208 | A | * | 2/1995  | Campbell ..................... 396/429 |
| 5,570,992 | A | * | 11/1996 | Lemelson .................. 414/744.3 |

(Continued)

FOREIGN PATENT DOCUMENTS

| JP | 08124990  | A | 5/1996 |
|----|-----------|---|--------|
| JP | 10335413  | A | 12/1998 |

(Continued)

OTHER PUBLICATIONS

International Search Report and Written Opinion of the International Searching Authority mailed Apr. 29, 2010 in PCT/US2009/059570.

*Primary Examiner* — Scott Lowe
(74) *Attorney, Agent, or Firm* — Patterson + Sheridan, LLP

(57) ABSTRACT

A method and apparatus for a transfer robot that having at least one image sensor disposed thereon is provided. The transfer robot includes a lift assembly having a first drive assembly for moving a first platform relative to a second platform in a first linear direction, an end effector assembly disposed on the second platform and movable in a second linear direction by a second drive assembly, the second linear direction being orthogonal to the first linear direction, at least one image sensor, and a lighting device associated with the at least one image sensor.

24 Claims, 15 Drawing Sheets

(56) References Cited

U.S. PATENT DOCUMENTS

| | | | | |
|---|---|---|---|---|
| 5,689,734 | A | * | 11/1997 | Bauer et al. .................... 396/28 |
| 5,694,864 | A | | 12/1997 | Langewellpott et al. |
| 5,722,513 | A | | 3/1998 | Rowan et al. |
| 6,182,796 | B1 | | 2/2001 | Perlstein et al. |
| 6,257,045 | B1 | * | 7/2001 | Hosokawa et al. ............ 73/1.79 |
| 6,371,713 | B1 | * | 4/2002 | Nishimura et al. ...... 414/222.13 |
| 6,679,479 | B1 | | 1/2004 | Watkins |
| 6,742,768 | B2 | | 6/2004 | Alba et al. |
| 7,072,739 | B2 | * | 7/2006 | Bash et al. .................... 700/245 |
| 7,184,076 | B2 | * | 2/2007 | Woodstock .............. 348/207.99 |
| 7,524,712 | B2 | * | 4/2009 | Tanaka et al. ................ 438/166 |
| 7,850,414 | B2 | * | 12/2010 | Uratani et al. ............. 414/744.2 |
| 8,029,504 | B2 | * | 10/2011 | Long .............................. 606/37 |
| 8,141,924 | B2 | * | 3/2012 | Albin ........................... 294/106 |
| 8,272,830 | B2 | * | 9/2012 | Kurita et al. .............. 414/749.5 |
| 8,479,607 | B2 | * | 7/2013 | Fukuma et al. ........... 74/490.01 |
| 2003/0043382 | A1 | * | 3/2003 | Borden et al. ................ 356/502 |
| 2003/0053806 | A1 | * | 3/2003 | Schneider .................... 396/427 |
| 2005/0088187 | A1 | * | 4/2005 | Borden et al. ................ 324/752 |
| 2007/0073439 | A1 | * | 3/2007 | Habibi et al. ................ 700/213 |
| 2008/0013822 | A1 | * | 1/2008 | Pai et al. ..................... 382/145 |
| 2008/0316482 | A1 | * | 12/2008 | Hoshizaki et al. ........... 356/317 |
| 2008/0316504 | A1 | * | 12/2008 | Nemets et al. ............... 356/614 |
| 2010/0086380 | A1 | | 4/2010 | Kurita et al. |
| 2010/0196124 | A1 | * | 8/2010 | Fukuma et al. .............. 414/217 |

FOREIGN PATENT DOCUMENTS

| | | |
|---|---|---|
| JP | 11087456 A | 3/1999 |
| JP | 11087460 A | 3/1999 |
| JP | 2006224297 A | 8/2006 |
| KR | 20050006445 | 1/2005 |

* cited by examiner

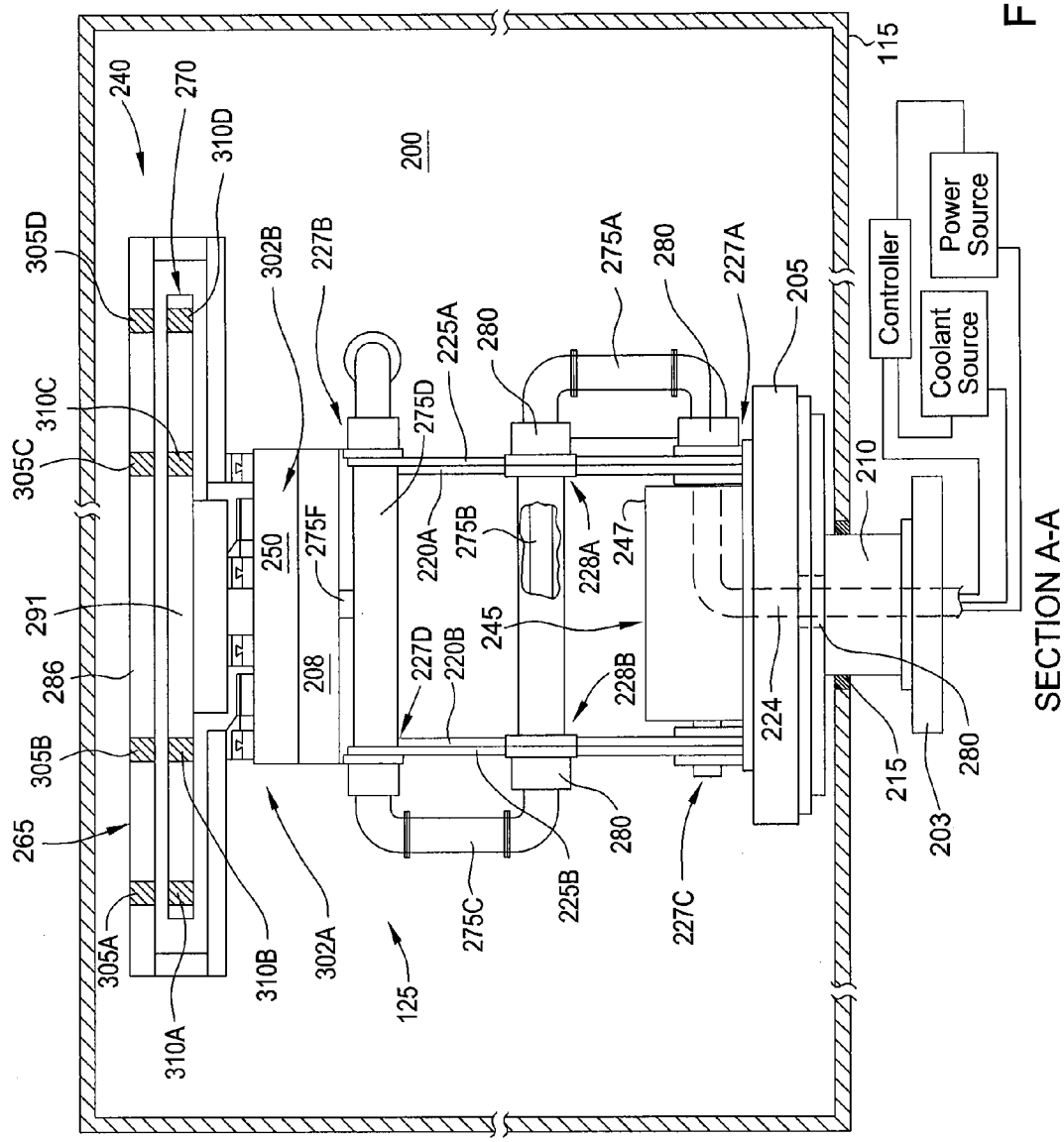

SECTION E-E

SECTION B-B

SUBSTRATE TRANSFER ROBOT WITH CHAMBER AND SUBSTRATE MONITORING CAPABILITY

CROSS-REFERENCE TO RELATED APPLICATION

This application claims benefit of U.S. Provisional Patent Application No. 61/246,906, filed Sep. 29, 2009, which is incorporated herein by reference.

BACKGROUND OF THE INVENTION

Field of the Invention

Embodiments of the present invention generally relate to a transfer robot for use in the transfer and support of large area flat media, such as a large area substrate.

Description of the Related Art

Flat media, such as rectangular, flexible sheets of glass, plastic or other material is typically used in the manufacture of flat panel displays, solar devices, among other applications. Materials to form electronic devices, films and other structures on the flat media are deposited onto the flat media by numerous processes. The processes are typically performed in a vacuum chamber which requires handling of the flat media numerous times to move the flat media in and out of the vacuum chamber.

The size of the flat media is getting larger with each generation in order to have more usable surface area for deposition and electronic device fabrication. Currently, the flat media includes a surface area of greater than 4 square meters that is processed. The trend towards increasingly larger substrates and smaller device features requires increasingly precise positional accuracy of the flat media in the various vacuum chambers. Ensuring positional accuracy not only prevents collisions and/or breakage of the flat media, but also facilitates accurate placement of the flat media on a susceptor in the vacuum chambers. Monitoring of the orientation of the flat media in the vacuum chambers is a challenge. Additionally, monitoring of the conditions of the interior of the vacuum chambers without shutting the system down is challenging. While some conventional processing systems include view windows formed in walls of the vacuum chamber, the view windows may not allow full view of the interior of the vacuum chamber.

Therefore, there is a need in the art for a transfer robot having the capability to provide real-time monitoring of the flat media and the various vacuum chambers the flat media is moved through.

SUMMARY OF THE INVENTION

Embodiments described herein generally provide an apparatus for a transfer robot having at least one optical sensor disposed thereon and a method for transferring a substrate using the same. In one embodiment, a transfer robot for use in a vacuum environment is described. The transfer robot comprises a lift assembly having a first drive assembly for moving a first platform relative to a second platform in a first linear direction, an end effector assembly disposed on the second platform and movable in a second linear direction by a second drive assembly, the second linear direction being orthogonal to the first linear direction, at least one image sensor, and a lighting device associated with the at least one image sensor.

In another embodiment, a transfer robot for use in a vacuum environment is described. The transfer robot comprises a lift assembly comprising a first base rotatably coupled to a second base, a plurality of support members coupling the second base to a platform, a first drive assembly for moving the platform relative to the second base in a first linear direction, an end effector assembly disposed on the platform and movable in a second linear direction by a second drive assembly, the second linear direction being substantially orthogonal to the first linear direction, and an image sensor coupled to one or both of the second base and the platform.

In another embodiment, a method for transferring a substrate from a transfer chamber to a processing chamber is described. The method includes providing a substrate on an end effector module disposed on a robot in the transfer chamber, transferring the substrate along a travel path through an opening between a processing chamber and the transfer chamber, and viewing one or both of the substrate and the interior of the processing chamber using an image sensor and lighting devices disposed on the robot as the substrate is transferred to the processing chamber.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is an end view of the transfer robot along section A-A of FIG. 2B.

DETAILED DESCRIPTION

Embodiments described herein provide a method and an apparatus for transferring large area flat media, such as a large area substrate made of glass, plastic, or other material suitable for electronic device formation. The large area substrates as described herein may include an area on a major surface of about 10,000 $cm^2$ or larger. It is contemplated that the transfer robot as described herein may also be beneficially utilized in the transfer of smaller substrates.

Figure 1:
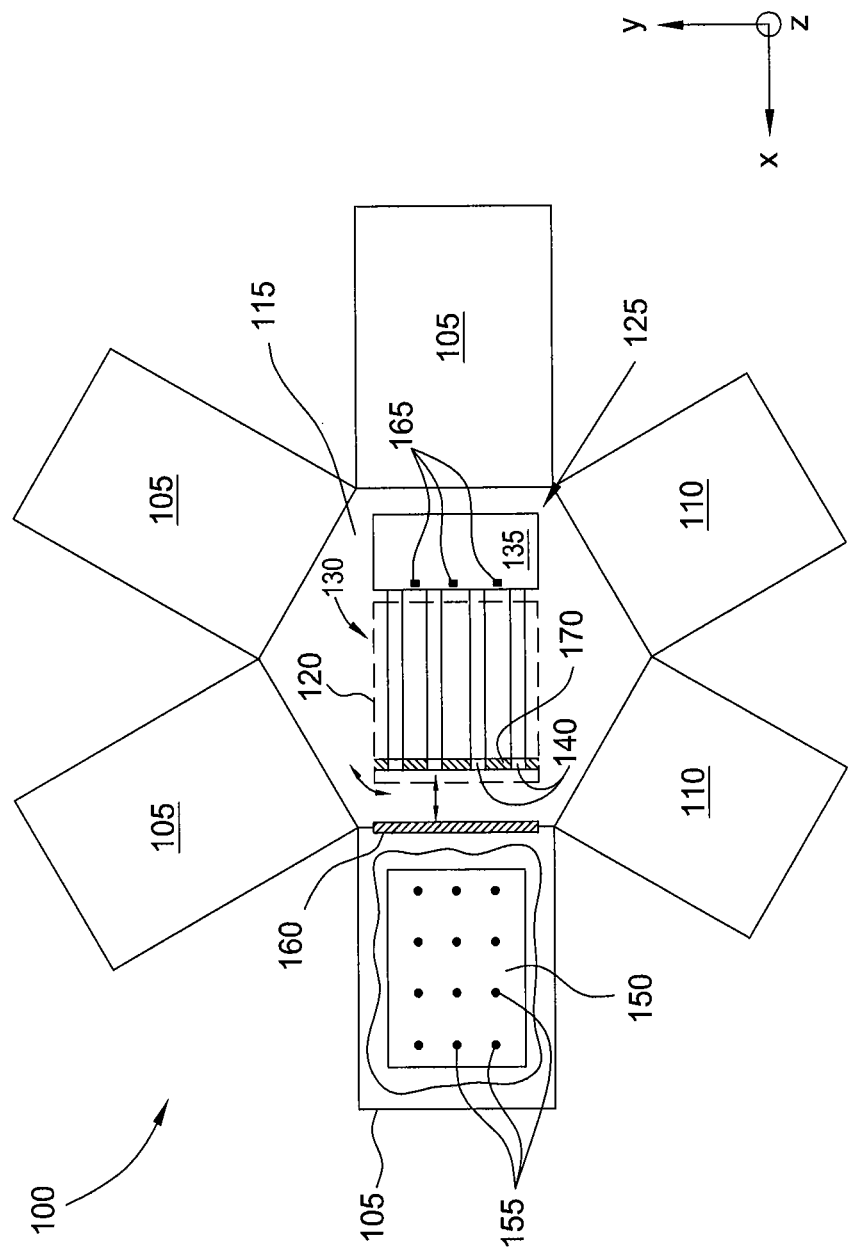
FIG. 1 is a top plan view of a multi-chamber substrate processing system.

FIG. 1 is a top plan view of a multi-chamber substrate processing system 100 suitable for the fabrication of thin-film transistors (TFT), organic light emitting diodes (OLEDS) and solar cell fabrication on flat media. The system 100 includes a plurality of processing chambers 105 and one or more load lock chambers 110 positioned around a central transfer chamber 115. The processing chambers 105 may be configured to complete a number of different processing steps to achieve a desired processing of flat media, such as a large area substrate 120 (outlined in dashed lines).

Positioned within the transfer chamber 115 is a transfer robot 125 having an end effector 130. The end effector 130 is configured to be supported and move independently of the transfer robot 125 to transfer the substrate 120. The end effector 130 includes a wrist 135 and a plurality of fingers 140 adapted to support the substrate 120. In one embodiment, the transfer robot 125 is configured to be rotated about a vertical axis and/or linearly driven in a vertical direction (Z direction) while the end effector 130 is configured to move linearly in a horizontal direction (X and/or Y direction) independent of and relative to the transfer robot 125. For example, the transfer robot 125 raises and lowers the end effector 130 (Z direction) to various elevations within the transfer chamber 115 to align the end effector 130 with openings in the processing chambers 105 and the load lock chambers 110. When the transfer robot 125 is at a suitable elevation, the end effector 130 is extended horizontally (X or Y direction) to transfer and/or position the substrate 120 into and out of any one of the processing chambers 105 and the load lock chambers 110. Additionally, the transfer robot 125 may be rotated to align the end effector 130 with other processing chambers 105 and the load lock chambers 110.

A portion of the interior of one of the processing chambers 105 has been removed to expose a substrate support or susceptor 150 that is adapted to receive and support the large area substrate 120 during processing. The susceptor 150 includes a plurality of lift pins 155 that are movable relative to an upper surface of the susceptor 155 to facilitate transfer of the large area substrate 120. In one example of a transfer process of the large area substrate 120, the lift pins 155 are extended away from or above the upper surface of the susceptor 150. The end effector 130 extends in the X direction into the processing chamber 105 above the extended lift pins. The transfer robot 125 lowers the end effector 130 in the Z direction until the large area substrate 120 is supported by the lift pins 155. The lift pins 155 are spaced to allow the fingers 140 of the end effector 130 to pass the lift pins 155 without interference. The end effector 130 may be further lowered to assure clearance between the large area substrate 120 and the fingers 140 and the end effector 130 is retracted in the X direction into the transfer chamber 115. The lift pins 155 may be retracted to a position that is substantially flush with the upper surface of the susceptor 150 in order to bring the large area substrate 120 into contact with the susceptor 150 so the susceptor 150 supports the large area substrate 120. A slit valve or door 160 between the transfer chamber 115 and the processing chamber 105 may be sealed and processing may be commenced in the processing chamber 105. To remove the large area substrate 120 after processing, the transfer process may be reversed, wherein the lift pins 155 raise the large area substrate 120 and the end effector 130 may retrieve the large area substrate 120.

The environment in the substrate processing system 100 is isolated from ambient pressure (i.e. pressure outside the system 100) and is maintained at a negative pressure by one or more vacuum pumps (not shown). During processing, the processing chambers 105 are pumped down to pre-determined pressures configured to facilitate thin film deposition and other processes. Likewise, the transfer chamber 115 is held at a reduced pressure during transfer of the large area substrates to facilitate a minimal pressure gradient between the processing chambers 105 and the transfer chamber 125. In one embodiment, the pressure in the transfer chamber 115 is maintained at a pressure lower than ambient pressure. For example, the pressure in the transfer chamber may be about 7 Torr to about 10 Torr while the pressure in the processing chambers 105 may be lower. In one embodiment, the maintained pressure within the transfer chamber 115 may be substantially equal to the pressure within the processing chambers 105 and/or load lock chambers 110 to facilitate a substantially equalized pressure in the system 100

During the transfer of the large area substrate 120 in the transfer chamber 115 and the processing chambers 105, proper alignment of the large area substrate 120 is crucial to prevent collisions and/or damage of the large area substrate 120. Additionally, the interior of the system 100 must be kept clean and free from debris such as broken pieces of a substrate, broken equipment, and other particulate contamination. While some conventional systems include view windows allowing line of sight viewing into the interior of the various chambers 105, 110 and 115, the windows may not allow a full view and/or precise inspection of the large area substrates and the interior of the various chambers 105, 110 and 115. Also, the conventional systems are not configured to view the large area substrate 120 and provide a metric of processing results while the large area substrates are in the system.

To overcome the challenges of the conventional systems, the transfer robot 125 includes one or more optical image sensors 165 and 170 disposed on the transfer robot 125. The one or more optical image sensors 165, 170 may be optical scanners, imagers or cameras, such as a charged-coupled device (CCD), a complimentary metal oxide semiconductor (CMOS) device, a video camera, and the like. In one embodiment, one or more of the optical image sensors 165, 170 are mounted on the transfer robot 125 in a position to view the large area substrate 120, the fingers 140 and any object in the line of sight view of the sensors 165, 170. In this embodiment, the image sensors 165, 170 may be oriented to view objects substantially in the X and Y direction as well as the Z direction as the transfer robot 125 is stationary or moving in the system 100. The image sensors 165, 170 may include wide angle optics, such as a fisheye lens, to enable a greater field of view.

Figure 2A:
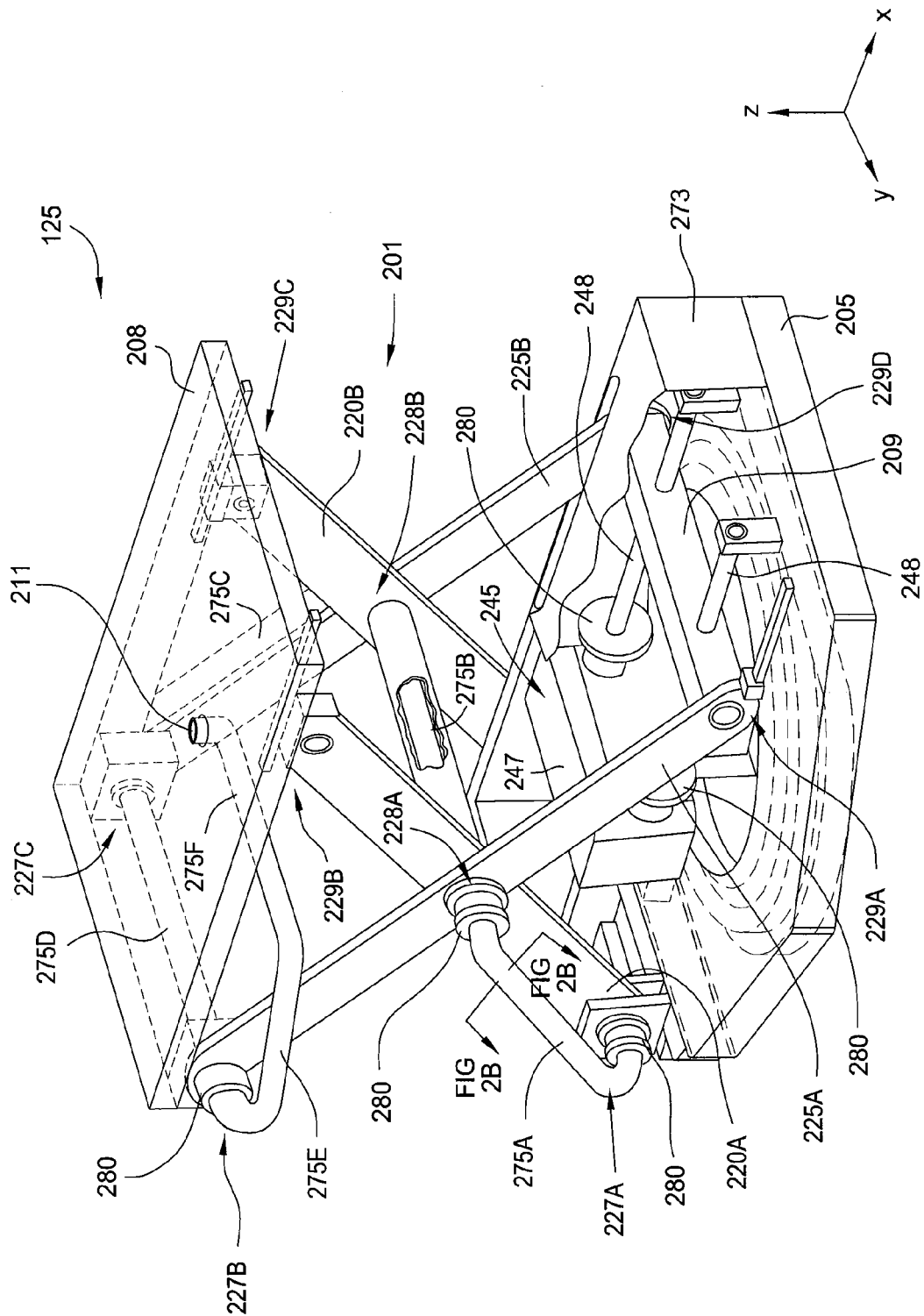
FIG. 2A is an isometric view of one embodiment of a transfer robot that may be used in the processing system of FIG. 1.

FIG. 2A is an isometric view of one embodiment of a transfer robot 125 that may be used in the transfer chamber 115 of FIG. 1. The transfer robot 125 includes a first assembly 201 adapted to rotate and move vertically (Z direction). In FIG. 2A, a second assembly, which includes an end effector, is not shown for clarity in describing the first assembly 201. The first assembly 201 includes a plurality of support arms 220A, 220B and 225A, 225B coupled between a first platform 205 and a second platform 208. In one embodiment, the first platform 205 comprises a rotatable base. The platform 208 provides an upper surface to receive and support the second assembly, which is adapted to move linearly relative to the platform 208. The plurality of support arms 220A, 220B, 225A 225B include a plurality of pivot points 227A-227D (227D is not shown in this view) and a plurality of movable coupling points 229A-229D. The plurality of support arms 220A, 220B and 225A, 225B are rotatably coupled to each other at a pair of central pivot points 228A and 228B.

A linear actuator 245 is coupled between the base 205 and support arms 225A, 225B at the movable coupling points 229A, 229D. The linear actuator 245 includes a motor housing 247 coupled to the base 205 and at least one drive shaft 248 (two are shown) that controls the motion of the ends of the support arms 225A, 225B in the X direction relative to the housing 247. The motor housing 247 may include a drive system, such as a motor and a reduction gear unit coupled to the at least one drive shaft 248. In one embodiment, the drive shaft 248 is a lead screw or Acme thread screw.

One end of each of the support arms 225A, 225B is coupled to the shaft 248 by a cross member 209 while the opposing ends of each of the support arms 225A, 225B are coupled to the platform 208 at pivot points 227B and 227C. In one embodiment, the cross member 209 includes a nut or other device adapted to transfer the rotatable motion of the shaft 248 to the cross member 209. One end of each of the support arms 220A, 220B are rotatably coupled to the base 205 at pivot points 227A, 227D while the opposing end of each of the support arms 220A, 220B are movably coupled to the platform 208 at movable coupling points 229B, 229C. The linear actuator 245 is adapted to provide a motive force to the support arms 225A, 225B thereby causing relative movement between support arms 220A, 220B and 225A, 225B that changes the elevation of the platform 208 relative to the first platform 205. In one embodiment, the linear actuator 245 may be a pneumatic or hydraulic cylinder, a Sawyer motor, or other suitable linear actuator. A cover 273, a portion of which has been removed, is disposed over the drive shafts 248 and the movable coupling points 229A, 229D.

The first assembly 201 also includes a plurality of conduits 275A-275F (275D and portions of 275C, 275F are shown in phantom in this view) configured to provide electrical and fluid communication to the end effector (not shown) through the base 205. The conduits 275A-275F provide an electrical and/or fluid path from an source (not shown) to a port 211 in the platform 208. At least a portion of the conduits 275A-275F are adapted to move with the support arms 220A, 220B, 225A, 225B. To provide this movement, at least a portion of the conduits 275A-275F are connected to each other by rotary seals 280 coupled between respective ends of the conduits 275A-275F. Rotary seals 280 are also coupled to the drive shafts 248. In one embodiment, the rotary seals 280 coupled to the conduits 275A-275F are configured as rotatable feed-throughs for electrical signals, wires, and/or fluids, such as cooling fluids. Each rotary seal 280 may be a magnetic vacuum seal that is configured to withstand negative pressure while sealing and facilitating rotation. In one aspect, each of the conduits 275A-275F are collectively configured as a hermetically sealed conduit for a fluid and any components that may be housed therein.

Figure 2B:
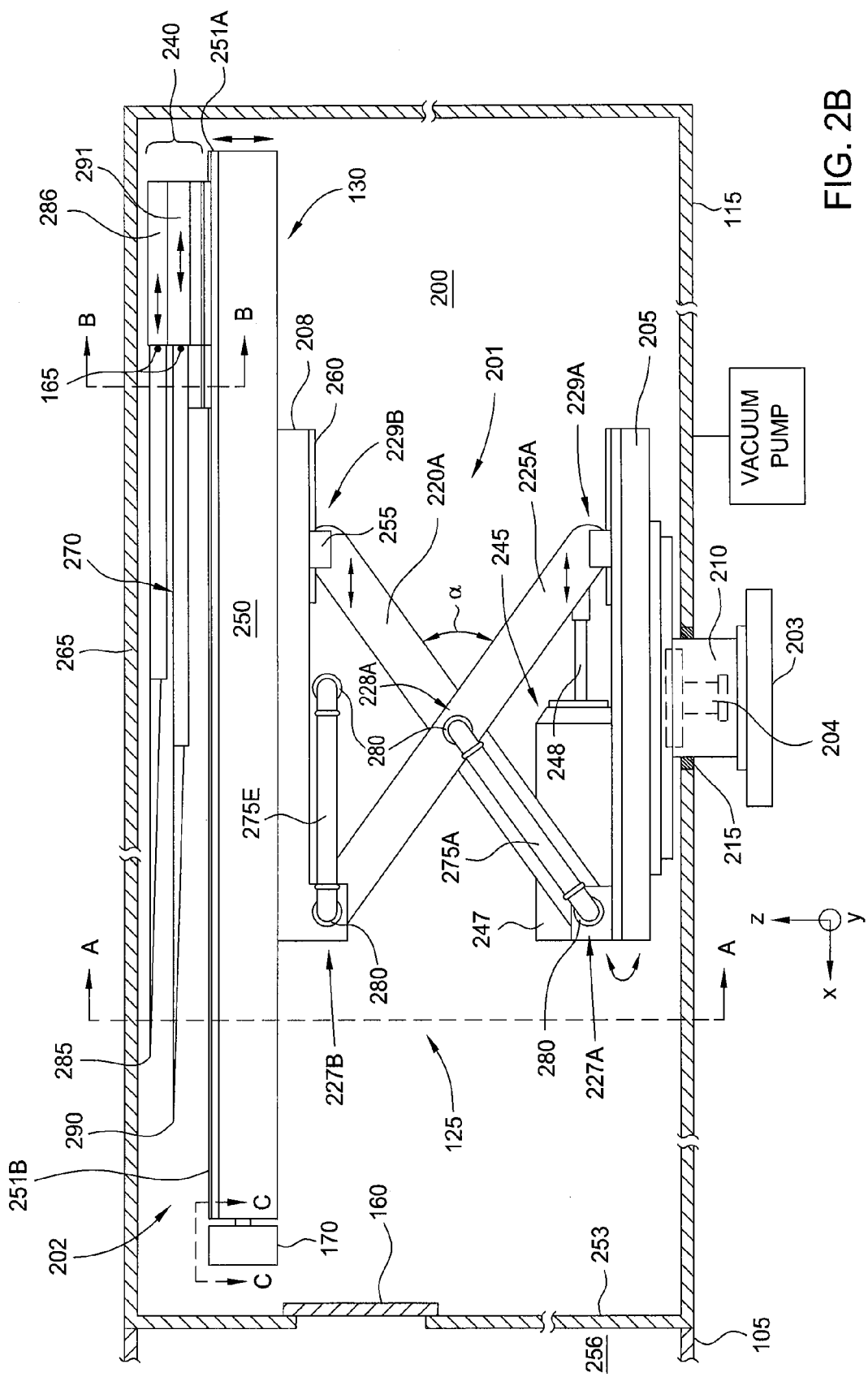
FIG. 2B is a schematic side view of the transfer robot of FIG. 2A positioned in the transfer chamber of FIG. 1.

FIG. 2B is a schematic side view of the transfer robot 125 of FIG. 2A positioned in the transfer chamber 115 of FIG. 1. The transfer chamber 115 includes a vacuum enclosure 200 that is sized to allow the transfer robot 125 to move and transfer large area substrates therein. The transfer robot 125 includes the first assembly 201 adapted to rotate and move in a vertical direction (Z direction) and a second assembly 202 adapted to move laterally or horizontally (X direction). Negative pressure is provided to the vacuum enclosure 200 by a vacuum pump adapted to maintain a low pressure within the vacuum enclosure 200. In one embodiment, the transfer robot 125 comprises a first or fixed base 203 that is fixed relative to the transfer chamber 115 and a first platform 205 coupled by a support stem 210. The first base 203 may be fastened to a clean room floor or other structure adapted to provide a foundation for the transfer robot 125.

A rotational drive system 204 (shown in phantom) is disposed in one or both of the support stem 210 and the first platform 205 to provide rotational movement between the fixed base 203 and first platform 205. In one embodiment, the rotational dive system 204 includes a motor and reduction gear unit coupled to a pinion gear. The pinion gear interfaces with a ring gear that is coupled to the first platform 205. A seal 215 is provided at the interface between the bottom of the transfer chamber 115 and the support stem 210 to maintain the vacuum environment within the vacuum enclosure 200. The seal 215 may be a polymeric or elastomeric member, or other material adapted to withstand negative pressure, vibration or movement between the transfer robot 125 and support stem 210.

The linear actuator 245 is coupled between the base 205 and a plurality of support arms 225A, 225B (225B is not shown in this view) at the movable coupling points 229A, 229D (only 229A is shown in this view). The linear actuator 245 includes the housing 247 coupled to the base 205 and the movable shaft 248. The movable shaft 248 moves in the X direction relative to the housing 247 to provide lateral movement to the movable coupling points 229A, 229D. The lateral movement of the movable coupling points 229A, 229D causes a change in an angle α between support arms 225A and 220A (and 220B which is not shown in this view), which facilitates vertical (Z direction) movement of the platform 208. For ease of description, portions of the support arms, and pivot and coupling points, which are not shown or hidden in FIG. 2B, will not be discussed unless otherwise noted. It is understood that the description of the support arms, and pivot and coupling points that are shown in this view have corresponding elements that are not shown and operate similarly, unless otherwise noted.

As explained above, one end of support arm 225A is coupled the shaft 248, while the opposing end of support arm 225A is coupled to the platform 208 at pivot point 227B. The platform 208 provides a mounting surface for the second assembly 202, which includes a base or frame portion 250 of an end effector 130. One end of support arm 220A is rotatably coupled to the base 205 at pivot point 227A while the opposing end of support arm 220A is movably coupled to the frame portion 250 at movable coupling point 229B. In one embodiment, the movable coupling point 229B includes a guide block 255 that is movable relative to a guide rail 260. The guide block 255 is coupled to the end of support arm 220A while the guide rail 260 is coupled to the platform 208. In one embodiment, the guide block 255 and guide rail 260 comprise a linear bearing assembly. A cover (not shown) may be disposed over the guide block 255 and guide rail 260 to prevent particles that may be generated by the relative movement of the movable coupling point 229B from entering the vacuum enclosure 200. The linear actuator 245 is adapted to provide a motive force to the support arm 225A thereby causing a relative movement between support arms 220A, 225A that changes the elevation of the end effector 130 relative to the base 205.

The second assembly 202 includes an end effector assembly 240 used to support and transfer a substrate (not shown). The end effector assembly 240 includes one or more end effector modules, such as an upper end effector module 265 and a lower end effector module 270. Each of the end effector modules 265, 270 are movably coupled to the frame portion 250 in a manner that allows independent movement of each end effector module 265, 270. Structural components of the first assembly 201 and second assembly 202 may be fabricated from materials such as aluminum, stainless steel, carbon steel with a plating, for example, a nickel plating, and combinations thereof among other suitable materials.

The upper and lower end effector modules 265, 270 are used to transport a substrate (not shown) within the vacuum enclosure 200 and through the door 160 for automated transfer to and from the processing chamber 105. The substrate is supported on a plurality of support surfaces configured as fingers 285 and 290 extending from a corresponding upper wrist assembly 286 and a lower wrist assembly 291. Each of the end effector modules 265, 270 are adapted to support and transfer a substrate thereon by movement relative to each other and the frame portion 250 in the X direction. Vertical adjustment of the substrate transfer plane may be provided by movement of the first assembly 201.

In this embodiment, a first end 251A of the second assembly 202 includes a sensor assembly shown as the image sensor 165 and a second end 251B of the second assembly 202 includes a sensor assembly shown as an image sensor 170. In one embodiment, the end effector assembly 240 includes the image sensor 165 in both of the upper wrist assembly 286 and lower wrist assembly 291 of the end effector assembly 240. Lighting devices (not shown) may be coupled to the upper wrist assembly 286 and/or lower wrist assembly 291 to aid in providing suitable light for operation of the image sensor 165. As one alternative, the image sensor 165 may include an integral light source. In another alternative, lighting devices (not shown) may be coupled to portions of the interior walls of the transfer chamber 115 and/or processing chamber 105. In other embodiments, only one of the upper wrist assembly 286 or lower wrist assembly 291 may include an image sensor 165.

The opposing second end 251B of the second assembly 202 includes the image sensor 170 that is coupled to the frame portion 250. In some embodiments, both of the image sensors 165, 170 are configured to view a substrate (not shown) while the substrate is moving or stationary. In one aspect, the image sensor 165 on the first end 251A is configured to view one or a combination of a substrate, the end effector modules 265, 270 an interior wall 253 of the transfer chamber 115, the door 160, and an interior volume 256 of the processing chamber 105 or load lock chamber 110 (not shown), or any object or space within the view of the image sensor 165 in a substantial horizontal direction. In another aspect, the image sensor 170 disposed on the second end 251B is configured to view a substrate (not shown) and the end effector modules 265, 270 as the substrate is moving or stationary on the end effector modules 265, 270. In this embodiment, the image sensor 170 is configured to view objects or spaces in a substantially vertical (Z direction) orientation.

As the substrate is transferred or otherwise supported by the end effector modules 265, 270, the substrate may be at a temperature greater than the operating temperature of the various components of the transfer robot 125 and end effector assembly 240. The excess heat from the substrate may be transferred to the transfer robot 125 that may damage components of the transfer robot 125. Temperature control of the transfer robot 125 and the image sensors 165 and/or 170 is provided by the plurality of conduits 275A-275F (only 275A and 275E are shown in this view) adapted to provide a fluids to the end effector assembly 240 and other portions of the transfer robot 125. The conduits 275A-275F may additionally include apertures for wires providing electrical signals to the end effector assembly 240, such as signal lines for one or all of the image sensors 165, 170. At least a portion of the conduits 275A-275F are adapted to move with the support arms 220A, 225A and at least a portion of the conduits 275A-275F are connected to each other by rotary seals 280 coupled between respective ends of the conduits 275A-275F.

FIG. 3A is an end view of the transfer robot 125 along section A-A of FIG. 2B. In this view, a fluid and/or signal path from the base 205 to the end effector frame portion 250 is more clearly seen. The fluid and/or signal path is provided by a feed conduit 224 coupled to a coolant source, a power source, and a controller. The feed conduit 224 extends through the base 205 and is adapted to rotate with the base 205 by use of a rotary seal 280. Feed conduit 224 couples to conduit 275A and the fluid and/or signals are provided to the end effector frame portion 250 by conduit 275F. In one embodiment that will be described in greater detail in FIGS. 7A-8B, the frame portion 250, drive systems for the end effector assembly 240, and image sensors 165, 170 are provided with a cooling fluid from the coolant source. The fluid provided by the coolant source may be water, deionized water (DIW), ethylene glycol, nitrogen ($N_2$), helium (He), or other fluid used as a heat exchange medium.

Each of the upper and lower end effector modules 265, 270 include a plurality of extended members or fingers 305A-305D and 310A-310D, respectively. In this Figure, the upper end effector module 265 includes four fingers 305A-305D coupled to a first wrist 286 and the lower end effector module 270 includes four fingers 310A-310D coupled to a second wrist 291. Each of the fingers 305A-305D and 310A-310D include a collective upper surface that is substantially planar and adapted to support a substrate thereon. While four fingers are shown on each of the wrists 286, 291, any number of fingers may be used.

The upper and lower end effector modules 265, 270 are independently movable relative to the transfer robot 125 and each other. The end effector modules 265, 270 are coupled to independent drive assemblies 302A, 302B disposed in the end effector frame portion 250 which are described in more detail below. Independent and relative movement of the upper and lower end effector modules 265, 270 is provided by a first drive assembly 302A coupled to the lower end effector module 270 and a second drive assembly 302B coupled to the upper end effector module 265.

Figure 3B:
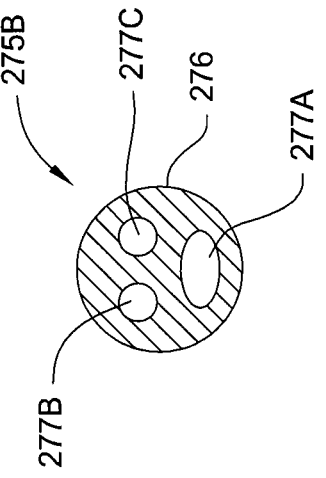
FIG. 3B is a cross-sectional view of one embodiment of the conduit of FIG. 3A.

FIG. 3B is a cross-sectional view of one embodiment of the conduit 275B of FIG. 3A. While not shown, other conduits 275B-275F are configured similarly. The conduit 275B includes a tubular body 276 having at least three internal passages 277A-277C formed therein. The internal passage 277A is adapted to contain wiring or signal cables while the internal passages 277B and 277C are configured as fluid passages. In one embodiment, the internal passage 277B is configured as a return path for cooling fluid and the internal passage 277C is configured as a supply path for cooling fluid. Each of the conduits 275A-275F may be fabricated from materials such as aluminum, stainless steel, nickel plated carbon steel or other suitable material.

Figure 4:
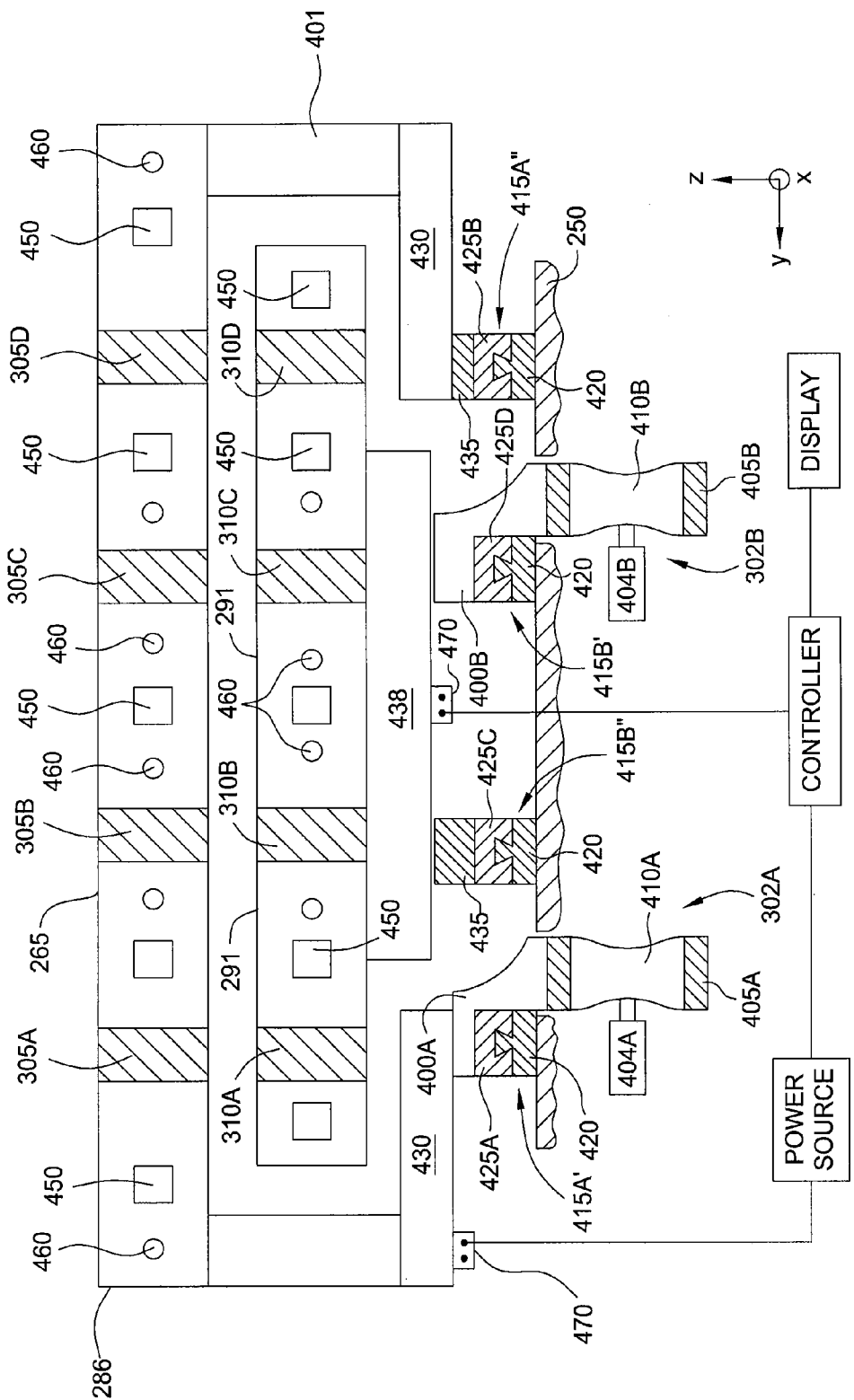
FIG. 4 is a schematic elevation view of the end effector modules of FIG. 2B.

FIG. 4 is a schematic elevation view of the end effector modules 265, 270 of FIG. 2B. The upper end effector module 265 is coupled to a first drive assembly 302A and the lower end effector module 270 is coupled to a second drive assembly 302B. The first drive assembly 302A includes a first connector 400A that is fixedly coupled to the upper end effector module 265 and a first belt 405A. The first belt 405A is coupled to a first drive pulley 410A that rotates to move the first belt 405A. The first drive pulley 410A is coupled to a motor 404A to provide rotational movement to the first drive pulley 410A. Relative movement between the upper surface of the end effector frame portion 250 and the upper end effector module 265 is provided by a plurality of linear bearing assemblies 415A', 415A" coupled between the end effector frame portion 250 and the upper end effector module 265.

Each of the linear bearing assemblies 415A', 415A" may include a plurality of first rails 420 fixedly coupled to an upper surface of the end effector frame portion 250. Each of the first rails 420 are movably mounted to a respective second rail 425A that is coupled to the first connector 400A and a respective second rail 425B that is coupled to a split wrist support 430. The split wrist support 430 is adapted to support the first wrist 286 at each end of the first wrist 286 by spacers 401 while providing ample room for the second wrist 291 of the lower end effector module 270 to move relative to the upper end effector module 265. Each of the second rails 425A, 425B may have a channel disposed therein to receive and move relative to the first rail 420. Bearings (not shown) may be provided at the interface between the first rails 420 and the second rails 425A, 425B. The second rail 425A is coupled to the split wrist support 430 by the first connector 400A and the second rail 425B is coupled to the split wrist support 430 by a shim 435.

In operation, the motor 404A associated with the first drive assembly 302A is actuated to rotate the first drive pulley 410A to move the first belt 405A. Movement of the first belt 405A is translated to the split wrist support 430. The split wrist support 430, which is coupled with the first drive pulley 410A and the second rails 425A, 425B, is moved relative to the end effector frame portion 250 and the lower end effector module 270. Thus, the upper end effector module 265 may be moved in the X direction relative to the lower end effector module 270 and/or the end effector frame portion 250.

The lower end effector module 270 is coupled to a second drive assembly 302A. The second drive assembly 302B includes a second connector 400B that is fixedly coupled to the lower end effector module 270 and a second belt 405B. The second belt 405B is coupled to a second drive pulley 410B that rotates to move the second belt 405B. The second drive pulley 410B is coupled to a motor 404B to provide rotational movement to the second drive pulley 410B. Relative movement between the upper surface of the end effector frame portion 250 and the lower end effector module 270 is provided by a plurality of linear bearing assemblies 415B', 415B" coupled between the end effector frame portion 250 and the lower end effector module 270.

Each of the linear bearing assemblies 415B', 415B" may include a plurality of first rails 420 fixedly coupled to an upper surface of the end effector frame portion 250. Each of the first rails 420 are movably mounted to a respective second rail 425D that is coupled to the second connector 400B and a respective second rail 425C that is coupled to a wrist support 438. The wrist support 438 is adapted to support the second wrist 291 while providing ample room for the first wrist 286 of the upper end effector module 265 to move relative to the lower end effector module 270. Each of the second rails 425C, 425D may have a channel disposed therein to receive and move relative to the first rail 420. Bearings (not shown) may be provided at the interface between the first rails 420 and the second rails 425C, 425D. The second rail 425D is coupled to the wrist support 438 by the second connector 400B and the second rail 425C is coupled to the wrist support 438 by a shim 435.

In operation, the motor 404B associated with the second drive assembly 302B is actuated to rotate the second drive pulley 410B to move the second belt 405B. Movement of the second belt 405B is translated to the wrist support 438. The wrist support 438, which is coupled with the second drive pulley 410B and the second rails 425C, 425D, is moved relative to the end effector frame portion 250 and the upper end effector module 265. Thus, the lower end effector module 270 may be moved in the X direction relative to the upper end effector module 265 and/or the end effector frame portion 250.

The motors 404A, 404B associated with each drive assembly 302A, 302B may be electrical motors, pneumatic motors, hydraulic motors or other type of motor or actuator suitable to provide the desired motion. Each of the first and second drive pulleys 410A, 410B may include a roughened surface or gear teeth (not shown) adapted to mesh with the inner surface of the belts 405A, 405B. Likewise, an inner surface of the belt may include a roughened surface or teeth to interface with the drive pulleys 410A, 410B. While each drive assembly 302A, 302B is described with motors and belts, other types of drives may be used to provide relative movement to the upper and lower end effector modules 265, 270. Other linear drives, such as magnetically actuated linear drives, may be used for the drive assemblies 302A, 302B.

Each of the upper wrist assembly 286 and lower wrist assembly 291 include a plurality of image sensors 450 disposed in or on the respective wrist assembly 286, 291. In one embodiment, an image sensor 450 is disposed adjacent the each of the fingers 305A-305D and 310A-310D while in other embodiments, more or less of the image sensors 450 are utilized. In one aspect, each of the wrist assemblies 286, 291 include one or more light sources 460 disposed adjacent the image sensors 450 to provide suitable lighting for the image sensors 450. The light sources 460 may be light emitting diodes (LED's), incandescent lamps, or other lighting device. Power and signal lines to the image sensors 450 and light sources 460 may be provided by a flexible cable and hose carrier 470 that is common in automated equipment. Each of the cable and hose carriers 470 include fluid hoses, signal transmission lines, such as electrical wires and/or fiber optic cables adapted to provide power and transmit data. Power for the light sources 460 is provided by a power source. Each of the image sensors 450 are coupled to a controller and a display to provide images to a user. In one embodiment, each of the image sensors 165 are directed to view a minor surface of a substrate (i.e., an edge). In another embodiment, each of the image sensors 165 are directed to view an area or direction that is substantially coplanar with the direction of the fingers 305A-305D and 310A-310D (X direction in this view).

Figure 5:
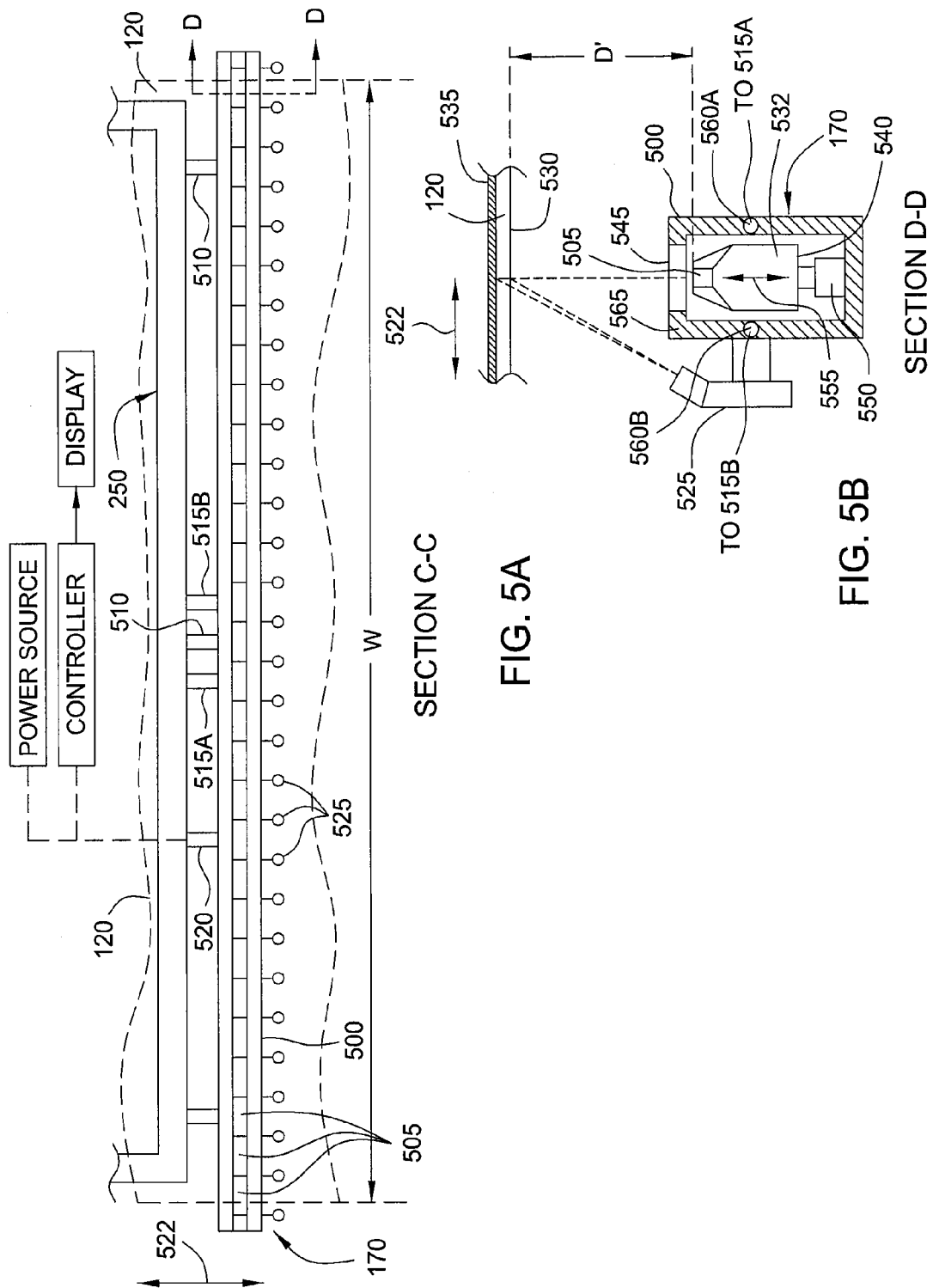
FIG. 5A is a schematic top view of the image sensor and a portion of the frame portion along section C-C of FIG. 2B.
FIG. 5B is a cross-sectional view of the image sensor taken along section D-D of FIG. 5A.

FIG. 5A is a schematic top view of the image sensor 170 and a portion of the frame portion 250 along section C-C of FIG. 2B. The image sensor 170 includes a housing 500 that encloses and protects a plurality of imaging chips 505 from the environment in the processing system 100. Each of the plurality of imaging chips 505 collectively form a linear scanning device configured to scan and/or image the entire width W of a substrate 120 (shown in dashed lines). In operation, the substrate 120 moves in a travel path 522 above the image sensor 170 such that the entire length and width of the substrate 120 may be imaged. The housing 500 is mounted to the frame portion 250 by a plurality of support members 510. One or more fluid lines, such as an inlet conduit 515A and outlet conduit 515B may be coupled between the frame portion 250 and the housing 500 to provide a coolant to the image sensor 170. Signals from the imaging chips 505 are provided to a controller through a signal conduit 520. The controller may be coupled to a display to provide images from the image sensor 170 to a user.

In one embodiment, the image sensor 170 includes a plurality of lighting sources 525. Each of the lighting sources 525 may be discrete LED's, cold cathode fluorescent lamps (CCFL's), hot cathode fluorescent lamps (HCFL's) and combinations thereof. Power to the lighting sources 525 may be provided by the controller and the power source. Each of the lighting sources 525 may be controlled to vary optical intensity and/or exposure time, such as by intermittent flashes or in a continuous mode.

FIG. 5B is a cross-sectional view of the image sensor 170 taken along section D-D of FIG. 5A. The image sensor 170 includes an in-line imaging device 532 disposed in a sealed internal volume 540 of the housing 500. The internal volume 540 separates the imaging device 532 from the vacuum environment in the processing system 100. The housing 500 includes a window 545 that is transparent to optical energy that is received from the substrate 120 and/or the thin film 535. In one embodiment, the housing 500 provides a hermetic seal that maintains a first pressure in the internal volume 540 that is greater than a second pressure in the processing system 100, the second pressure being less than atmospheric or ambient pressure, such as about 7 Torr to about 10 Torr. In one embodiment, the internal volume 540 is at or near atmospheric or ambient pressure during operation of the processing system 100.

The imaging device 532 is configured to view a backside 530 of the substrate 120. As the substrate 120 is moved along the travel path 522, alignment of the substrate 120 may be determined by the feedback from the imaging device 532. Additionally, defects in the substrate 120, such as cracks or chipped portions, may be determined by feedback from the imaging device 532. Additionally, as the substrate 120 is transparent or semi-transparent, the imaging device 532 may provide images of a thin film 535 formed on the substrate 120 as the substrate 120 moves along the travel path 522. Thus, as the substrate 120 is moving in the travel path 522, an image of the entire major surface of the substrate 120 may be provided to a user in real-time. The images may enable corrective action to be taken, such as corrections in misalignment of the substrate 120 and/or stopping the system 100 to remove a damaged substrate. Additionally, a metric of deposition of the thin film 535 may be provided to a user. Data such as deposition uniformity, edge exclusion (area at the edge of the substrate where no deposition occurs due to a shadow frame disposed over and shielding the edge from deposition) and a metric indicating proper alignment of a shadow frame (not shown) over the edge of the substrate 120 may be provided by the imaging device 532 and utilized to alert the user and/or implement corrective measures. For example, uniformity of the thin film 535 may be determined by the imaging device 532 and the uniformity data could be utilized to change deposition parameters in upstream or downstream processes. In another example, the imaging device 532 may detect variations in the width of the edge exclusion zone that may indicate misalignment of the shadow frame and measures may be taken to correct this misalignment in subsequent processes.

The image sensor 170 is coupled to the frame portion 250 in a manner that maintains a focal length or working distance D' from the backside 530 of the substrate 120. In one embodiment, the working distance D' is about 6 mm to about 15 mm, for example, between about 10 mm to about 13 mm. In one embodiment, focal length of the imaging chips 505 may be varied by an integrated focus control provided by the imaging device 532. In one embodiment, the housing 500 may be moved relative to the frame portion 250 to vary the working distance D'. For example, one or more actuators (not shown) may be coupled between the frame portion 250 and the housing 500 to adjust the working distance D'. In another embodiment, an actuator 550 may be coupled to the imaging device 532 to move the imaging device 532 in the direction indicated by reference numeral 555 in order to adjust the working distance D'.

During operation of the processing system 100, the temperature of the substrate 120 may reach or exceed a temperature of about 300 degrees Celsius (° C.). The positioning of the image sensor 170 in proximity to the substrate 120 may damage the imaging device 532 at the elevated temperatures. For example, the image sensor 170 may experience temperatures of about 160° C. at the position on the frame portion 250. In order to protect the components of the image sensor 170, the housing includes fluid channels 560A, 560B adapted to flow a thermal control fluid therein. In one embodiment, the fluid channels 560A and 560B are formed in a sidewall 565 of the housing 500 as shown. In another embodiment, the fluid channels 560A, 560B may be conduits attached to the interior or exterior of the sidewall 565.

Figure 6:
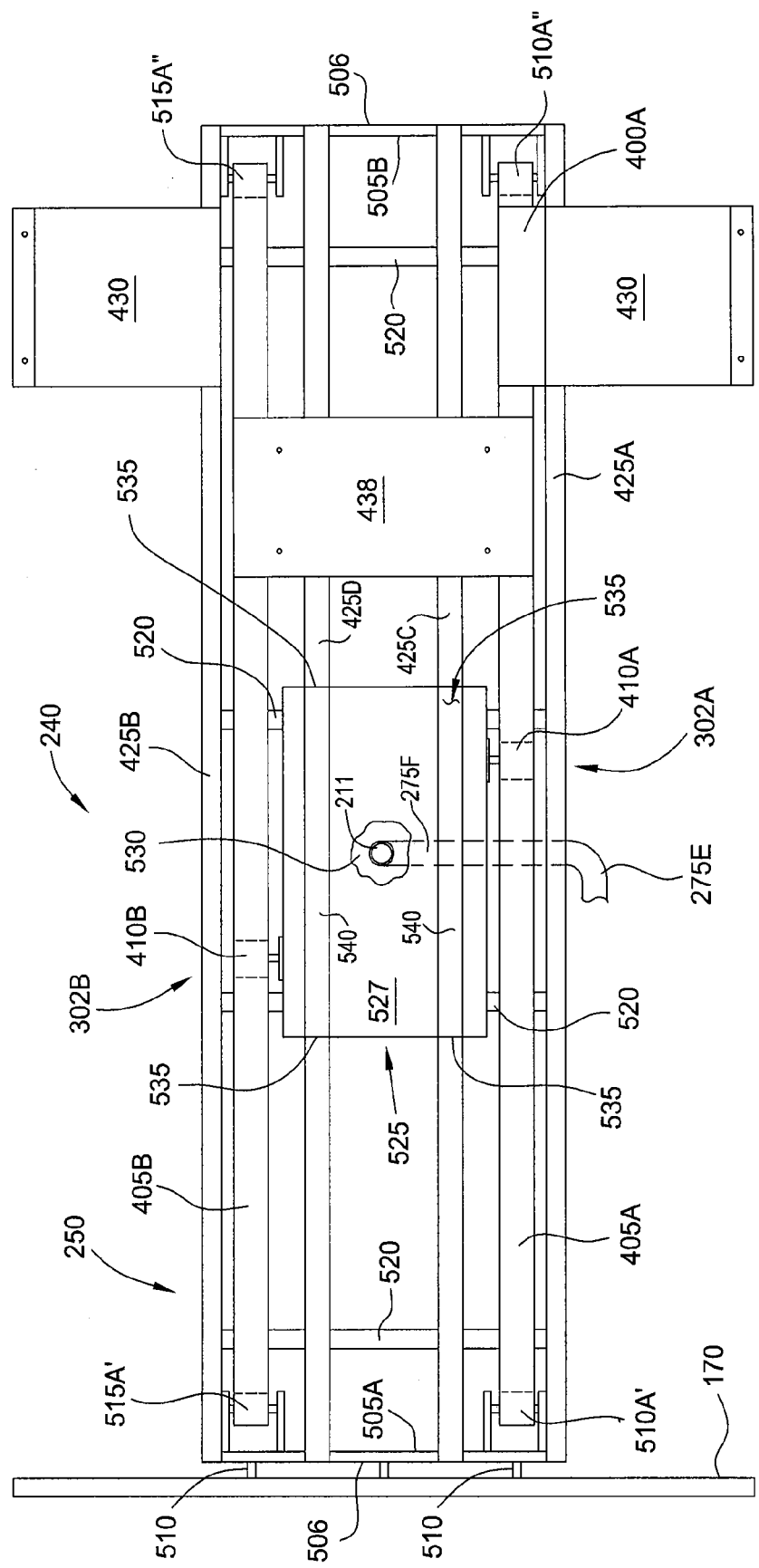
FIG. 6 is a top plan view of one embodiment of an end effector assembly.

FIG. 6 is a top plan view of one embodiment of an end effector assembly 240. In FIG. 6, the wrists 286 and 291 are not shown for clarity to show portions of the first drive assembly 302A and second drive assembly 302B disposed on the end effector frame portion 250. In this embodiment, the first drive assembly 302A includes the first drive pulley 410A and a plurality of idler pulleys 510A' and 510A" coupled to a drive belt 405A. The first drive pulley 410A is coupled to a motor (not shown). The first drive assembly 302A also includes the second rails 425A, 425B that are coupled to each other at opposing ends by cross-members 505A, 505B. Each of the cross-members 505A, 505B include a reflective surface 506 adapted to reflect heat away from the end effector assembly 240. The reflective surface 506 may be a polished surface of the material comprising the cross-members 505A, 505B, a sheet of reflective material, or a reflective coating. The second drive assembly 302B includes the second drive pulley 410B and a plurality of idler pulleys 515A' and 515A" coupled to a drive belt 405B. The second drive pulley 410B is coupled to a motor (not shown). The second drive assembly 302B also includes the second rails 425C, 425D that is coupled to each other at opposing ends by the cross-members 505A, 505B. Additional cross-members 520 may be coupled to or disposed between each of the second rails 425A-425D to provide mechanical integrity to the end effector frame portion 250.

The end effector assembly 240 also includes a housing 525 adapted to contain at least a portion of the motors driving each of the first drive assembly 302A and second drive assembly 302B, wires, controllers, and valves and associated plumbing for coolant devices. The housing 525 includes an interior volume 530 that is sealed from low pressures in the vacuum enclosure 200 (FIG. 3A). In one aspect, the housing 525 is configured as a hermetically sealed enclosure adapted to seal and protect components disposed therein from negative pressures within the vacuum enclosure 200. The housing 525 is in communication with the fluid and/signal path provided by a port 211 coupled to the plurality of conduits 275A-275F (FIG. 2A) disposed on the transfer robot 125. The housing 525 includes a removable lid 527 and a portion of which is removed to show the interior volume 530. Electrical signals and/or fluids are transferred to or from the housing 525 by the conduit 275F (FIG. 2A) through the port 211.

In one embodiment, the lid 527 includes at least a portion of the second rails 425C, 425D disposed on an upper surface thereof. The lid 527 may be removed to access the interior volume 530 and a portion of the second rails 425C, 425D coupled thereto are also removed. In this embodiment, the second rails 425C, 425D include terminating ends 535 that define discrete sections 540 of the second rails 425C, 425D that are coupled to the lid 527 and are removed with the lid 527.

Figure 7:
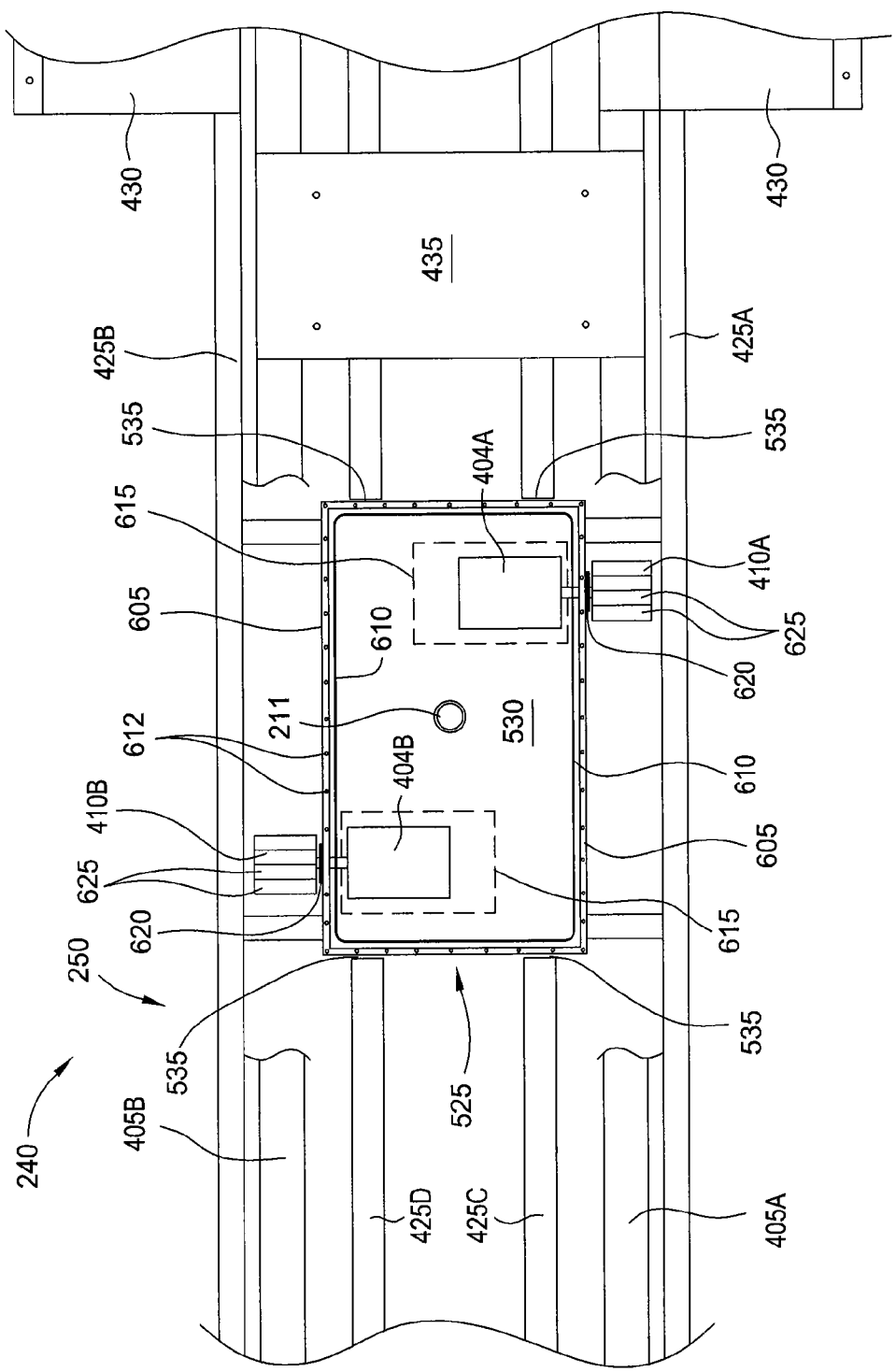
FIG. 7 is a top plan view of the end effector assembly shown in FIG. 6.

FIG. 7 is a top plan view of the end effector assembly 240 shown in FIG. 6 wherein the lid has been removed to more clearly show portions of the interior volume 530 of the housing 525. The housing 525 includes a plurality of sidewalls 605 and a sealing device 610 disposed on an upper surface of the sidewalls 605. The sealing device 610 may be an o-ring or gasket made of a polymeric or elastomeric material, or other compressible material adapted to seal the interior volume 530 from lower pressures that may be present in the vacuum enclosure 200 (FIG. 3A). The lid (not shown) is sealably coupled to the housing by a plurality of fasteners (not shown), such a screws or bolts, adapted to be received by a plurality of holes 612 disposed on an upper surface of the housing 525.

The housing 525 is adapted to maintain the pressure in the interior volume 530 at a pressure that is different than a pressure within the vacuum enclosure 200 in order to protect the components disposed therein and/or prevent particle contamination to the vacuum enclosure 200. For example, the interior volume 530 may be maintained at or near ambient pressure while the vacuum enclosure 200 is at a pressure that is substantially lower than ambient pressure. The sealed housing 525 prevents or minimizes outgassing from components or elements contained in the housing 525. Additionally, the sealed housing 525 contains any particles generated by the moving components disposed in the housing 525. In this manner, outgassing and particle contamination of the vacuum enclosure 200 may be avoided.

In one embodiment, one or both of the motors 404A, 404B are enclosed in a motor housing 615. Additionally, the motor housings 615 may provide additional sealing from negative pressures within the vacuum enclosure 200. Each of the motors 404A, 404B may include a reduction gear drive coupled between the motor and the drive pulleys 410A, 410B. Rotatable vacuum bearings or seals 620 may be provided at the interface between each motor 404A, 404B and the sidewall 605 to facilitate rotation of the respective shaft of each motor 404A, 404B while maintaining a pressure seal. Gears or teeth 625 are also shown on the drive pulleys 410A, 410B to provide a positive drive interface with respective belt 405A, 405B.

Figure 8B:
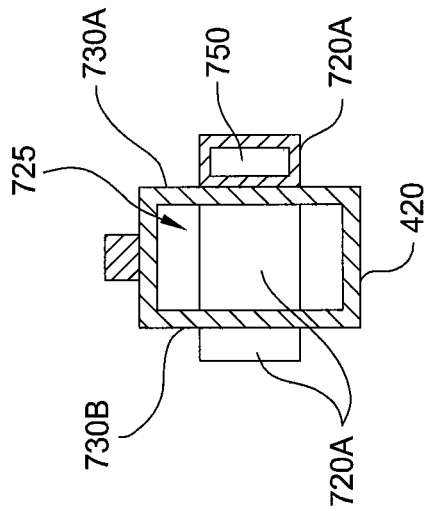
FIG. 8B is a cross-sectional view of the first rail and a portion of the first conduit of FIG. 8A.
Figure 8A:
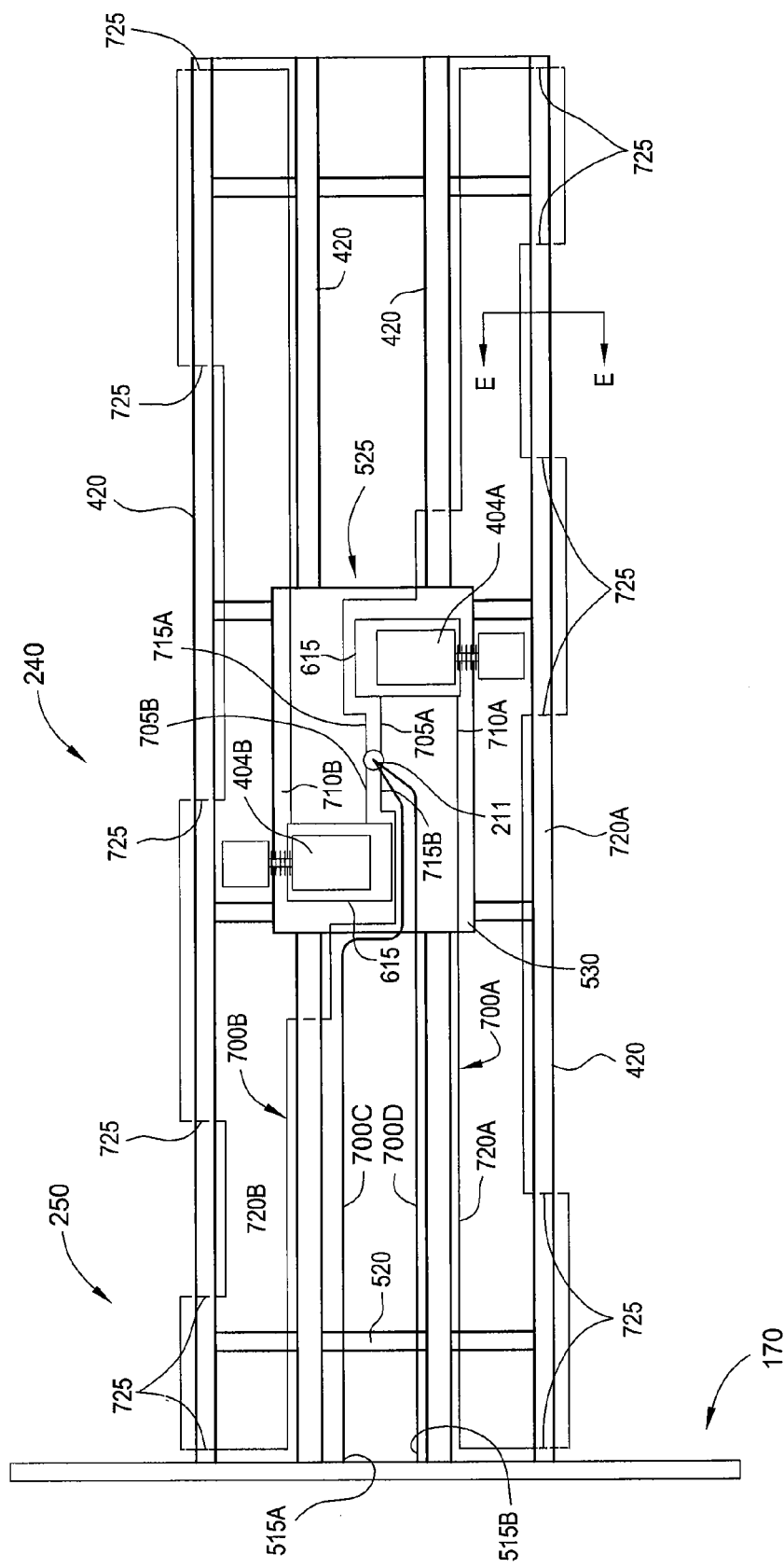
FIG. 8A is a schematic top view of another embodiment of an end effector assembly.

FIG. 8A is a schematic top view of another embodiment of an end effector assembly 240 showing a plurality of coolant lines 700A-700D. The coolant lines 700A, 700B are coupled to the port 211 and are in thermal communication with the motor housings 615 and the end effector frame portion 250. The coolant lines 700C and 700D are coupled to the port 211 and in communication with the inlet conduit 515A and outlet conduit 515B of the image sensor 170. In one embodiment, a first coolant line 700A includes a first inlet 705A that is coupled between the motor housing 615 surrounding motor 404A and the port 211. Cooling fluid flows from the port 211 through conduits (not shown) in the motor housing 615 coupled to a first outlet 710A. Cooling fluid flows from the first outlet 710A along a path defined by a first conduit 720A that is adjacent to and/or in thermal communication with the first rails 420. The cooling fluid flows through the first conduit 720A to a first return inlet 715A at the port 211. In one embodiment, the first conduit 720A is coupled to sidewalls of the first rails 420 and portions of the first conduit 720A are at least partially disposed within the first rails 420 at a plurality of feed-throughs 725.

A second coolant line 700B includes a second inlet 705B that is coupled between the motor housing 615 surrounding motor 404B and the port 211. Cooling fluid flows from the port 211 through conduits (not shown) in the motor housing 615 coupled to a second outlet 710B. Cooling fluid flows from the second outlet 710B along a path defined by a second conduit 720B that is adjacent to and/or in thermal communication with the first rails 420. The cooling fluid flows through the second conduit 720B to a second return inlet 715B at the port 211. The second conduit 720B is coupled to the sidewalls of the first rails 420 and portions of the second conduit 720B are at least partially disposed in the first rails 420 at a plurality of feed-throughs 725.

A third coolant line 700C and fourth coolant line 700D are coupled to the image sensor 170 to flow cooling fluid from the coolant source (FIG. 3A) to the image sensor 170. In one embodiment, the third coolant line 700C is an inlet conduit and the fourth coolant line is an outlet conduit.

FIG. 8B is a cross-sectional view of the first rail 420 and a portion of the first conduit 720A of along section E-E of FIG. 8A. In one embodiment, the first rail 420 is a tubular member and the first conduit 720A is coupled to sidewalls 730A, 730B of the first rail 420. The first conduit 720A is coupled to an inner sidewall 730A and is disposed through the first rail 420 at the feed-through 725. The first conduit 720A may include a tubular cross-section to define a fluid plenum 750 disposed therein. One or both of the first rail 420 and the first conduit 720A may be made of a thermally conductive material, such as aluminum, stainless steel, or nickel plated carbon steel. The first conduit 720A may be coupled to the first rail 420 by clamps, fasteners, welding, or other bond. The cooling fluid removes heat from the first rail 420 that may be transferred to the first rail 420 from a substrate (not shown) supported on the end effector (not shown).

Figure 9A:
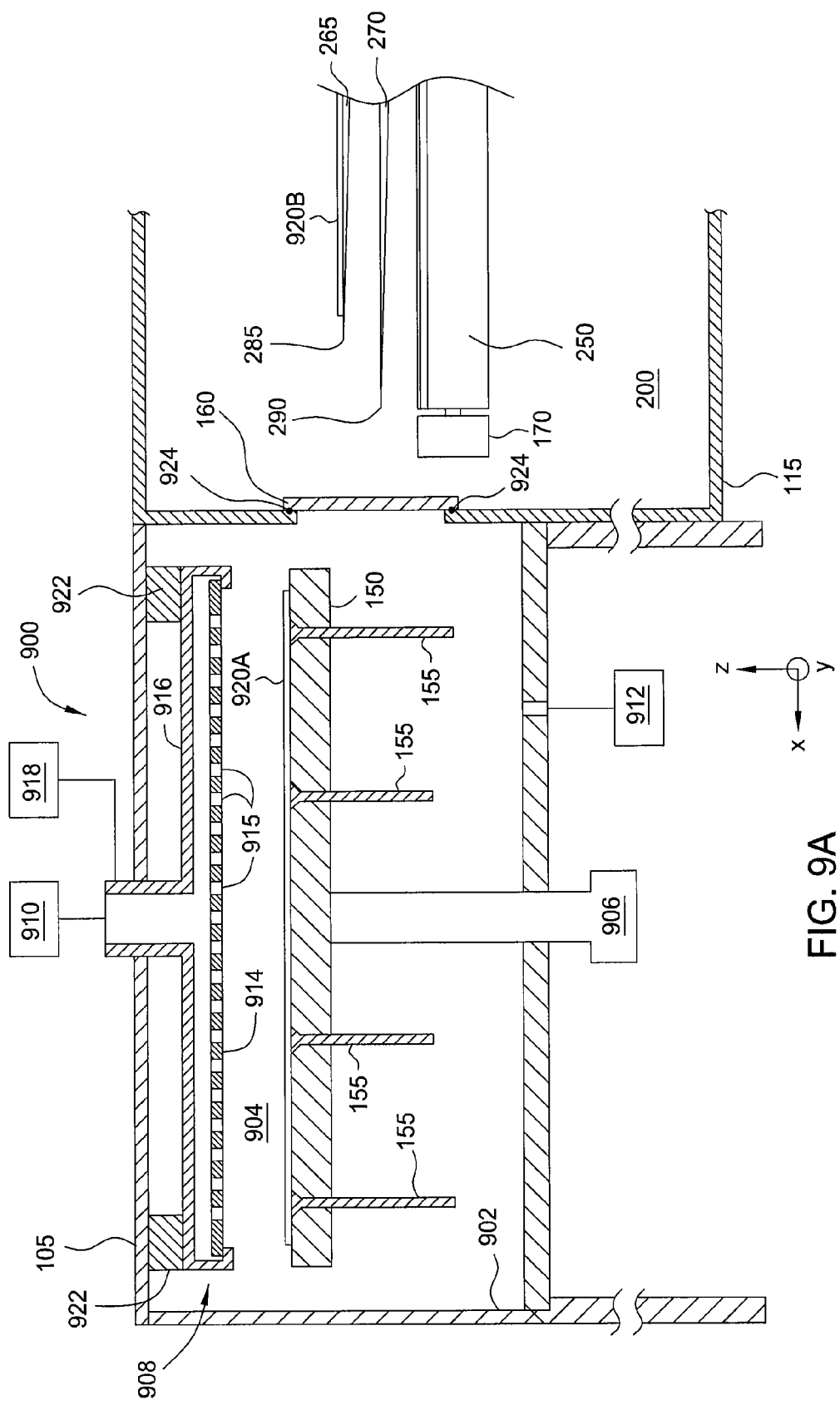
FIG. 9A is a schematic cross-sectional view of one embodiment of a plasma processing system disposed in a processing chamber of FIG. 1.

FIG. 9A is a schematic cross-sectional view of one embodiment of a plasma processing system 900 disposed in a processing chamber 105 of FIG. 1. The plasma processing system 100 is configured to process a large area substrate using plasma in forming structures and devices on the large area substrate for use in the fabrication of liquid crystal displays (LCD's), flat panel displays, organic light emitting diodes (OLED's), or photovoltaic cells for solar cell arrays. The large area substrate is depicted as a first substrate 920A in this embodiment. The first substrate 920A may be thin sheet of metal, plastic, organic material, silicon, glass, quartz, or polymer, among others suitable materials. The first substrate 920A may have a surface area greater than about 1 square meters, such as greater than about 2 square meters. The structures may be a plurality of back channel etch inverted staggered (bottom gate) thin film transistors which may comprise a plurality of sequential deposition and masking steps. Other structures may include p-n junctions to form photovoltaic cells.

The plasma processing system 900 generally comprises a chamber body 902 including a bottom and sidewalls defining a processing volume 904. A substrate support 150 is disposed in the processing volume 904. The substrate support 150 is adapted to support a first substrate 920A on a top surface during processing. The substrate support 150 is coupled to an actuator 906 configured to move the substrate support at least vertically (Z direction) to facilitate transfer of the first substrate 920A and/or adjust a distance between the first substrate 920A and a showerhead assembly 908. One or more lift pins 155 extend through the substrate support 150 and are adapted to facilitate transfer of the first substrate 920A by spacing the first substrate 920A away from the substrate support 150. In a processing position as shown, the lift pins 150 are adapted to be flush with or slightly below the upper surface of the substrate support 150 to allow the first substrate 920A to lie flat on the substrate support 150.

The showerhead assembly 908 is configured to supply a processing gas to the processing volume 904 from a processing gas source 910. The plasma processing system 900 also comprises an exhaust system 912 configured apply negative pressure to the processing volume 904. The showerhead assembly 908 is generally disposed opposing the substrate support 150 in a parallel manner.

In one embodiment, the showerhead assembly 908 comprises a gas distribution plate 914 and a backing plate 916. The backing plate 916 may function as a blocker plate to enable formation of a gas volume between the gas distribution plate 914 and the backing plate 916. The gas source 910 is connected to the gas distribution plate 914 by a conduit. Process gases are flowed from the gas source 910 to the processing volume 904 through a plurality of openings 915 in the gas distribution plate 914.

A radio frequency (RF) power source 918 is generally used to generate a plasma between the showerhead assembly 908 and the substrate support 150 during processing. During processing, a slit valve or door 160 between the transfer chamber 115 and the processing chamber 105 is closed. In one embodiment, the door 160 compresses a sealing device 924, such as an o-ring or elastomeric seal. The gas distribution plate 914, the backing plate 916, and the conduit are generally formed from electrically conductive materials and are in electrical communication with one another. The chamber body 902 is also formed from an electrically conductive material. The chamber body 902 is generally electrically insulated from the showerhead assembly 908. In one embodiment, the showerhead assembly 908 is mounted on the chamber body 902 by an insulator 922. In one embodiment, the substrate support 150 is also electrically conductive, and the substrate support 150 and the showerhead assembly 908 are configured to be opposing electrodes for generating a plasma of processing gases therebetween during processing.

Figure 9B:
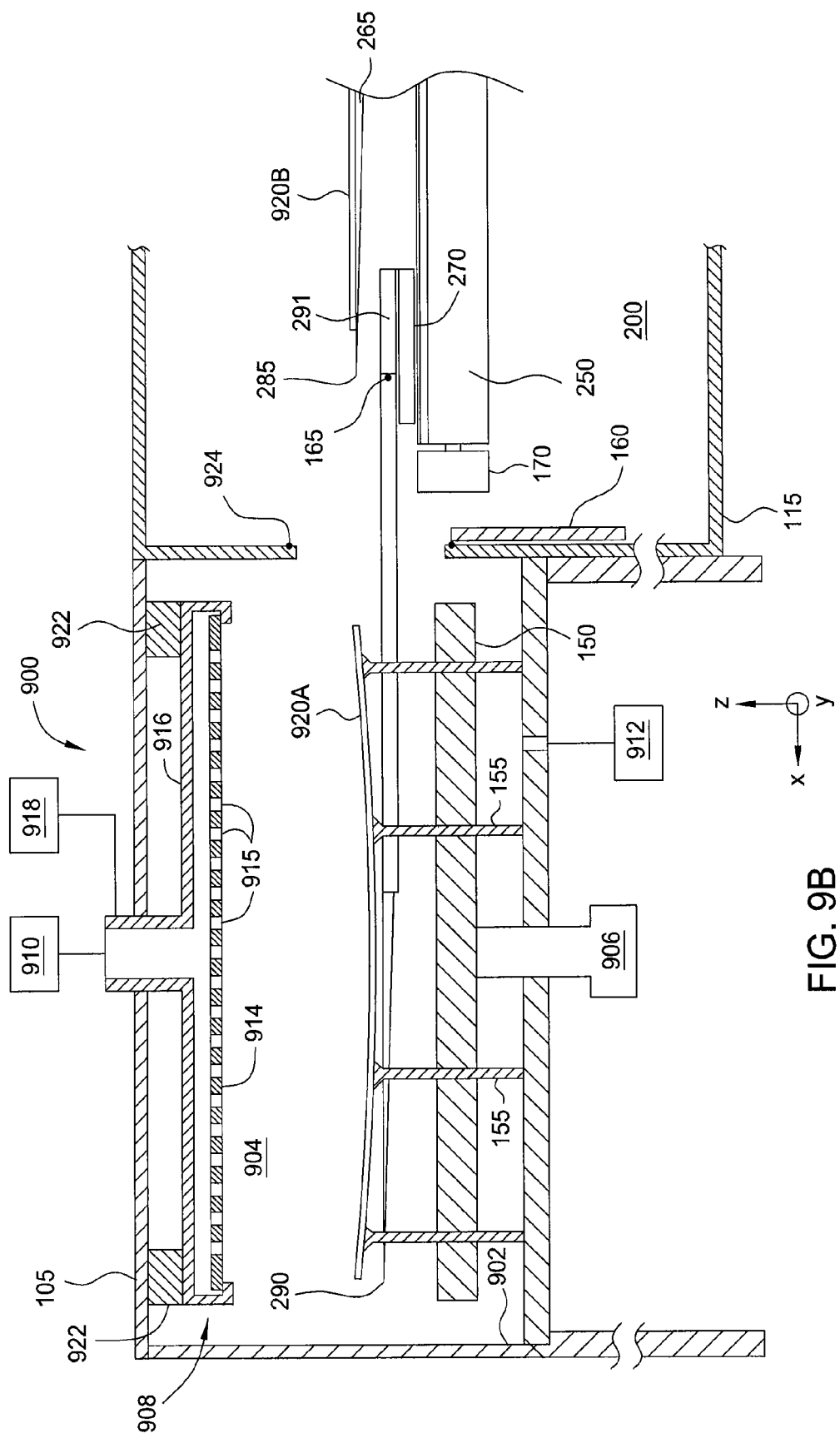
FIG. 9B is a schematic cross-sectional view the plasma processing system of FIG. 9A after processing of a substrate.

FIG. 9B is a schematic cross-sectional view the plasma processing system 900 after processing of the first substrate 920A. The door 160 is opened to allow the lower end effector module 270 to enter the processing volume 904 and access the substrate 920A. The actuator 906 lowers the substrate support 150 such that an end of the lift pins 155 contact a lower surface of the chamber body 902. In this embodiment, the substrate support 150 is shown in a transfer position to facilitate space for the fingers 290 of the lower end effector module 270 to access the area between the lower surface of the first substrate 920A and the upper surface of the substrate support 150. The lowering of the substrate support 150 causes the first substrate 920A to be supported by contact portions on an opposing end of the lift pins 155. In one embodiment, the lift pins 155 are different lengths which provides transfer and/or support of the first substrate 920A in a bowed orientation. When the first substrate 920A is supported by the lift pins 155, the lower end effector module 270 moves laterally (X direction) to a position between the substrate support 150 and the substrate 920A.

As the lower end effector module 270 enters the processing chamber 105, the image sensors 165 may view the processing volume 904, the sealing devices 924, as well as portions of the substrate support 150 and showerhead assembly 908. Images of the objects within the field of view of the image sensors 165 are provided to a user in order to assess the conditions within the transfer chamber 115 and/or the processing chamber 105. If conditions within the transfer chamber 115 and/or the processing chamber 105 are less than favorable, corrective action may be performed or scheduled for a later time.

Figure 9C:
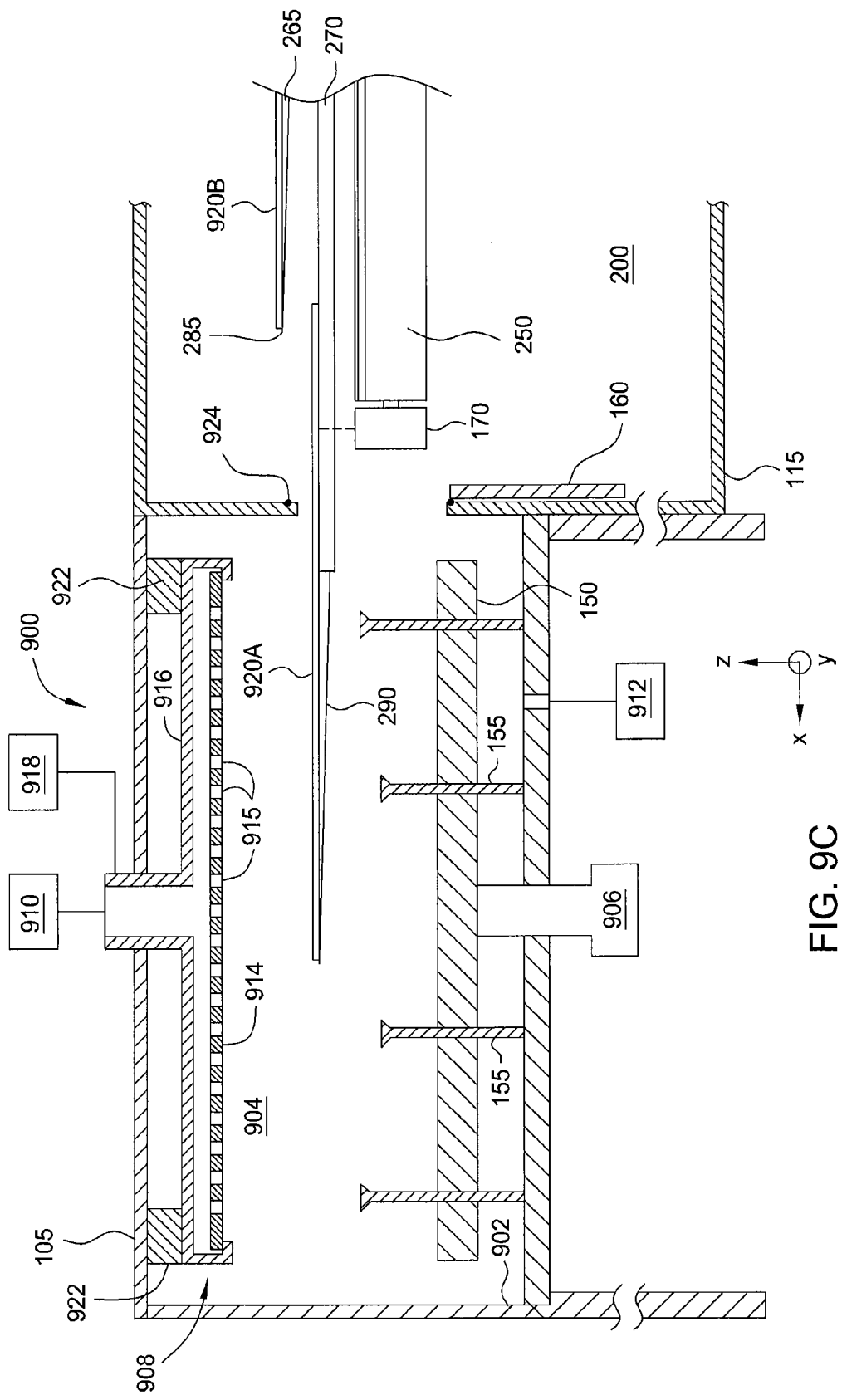
FIG. 9C is a schematic cross-sectional view of the plasma processing system of FIG. 9B showing the first substrate in a transfer position.

FIG. 9C is a schematic cross-sectional view of the plasma processing system 900 showing the first substrate 920A supported on the fingers 290 of the lower end effector module 270. In this embodiment, the transfer robot 125 is actuated vertically (Z direction) to raise the lower end effector module 270 in order to lift (Z direction) the first substrate 920A away from the lift pins 155. After the first substrate 920A is supported by the fingers 290 of the lower end effector module 270, the first substrate 920A may be removed from the processing volume 904. As the lower end effector module 270 is moving laterally (X direction) to remove the first substrate 920A, the image sensor 170 is scanning the first substrate 920A. Thus, defects in the first substrate 920A, as well as deposition progress on the first substrate 920A, may be monitored in real time.

Figure 9D:
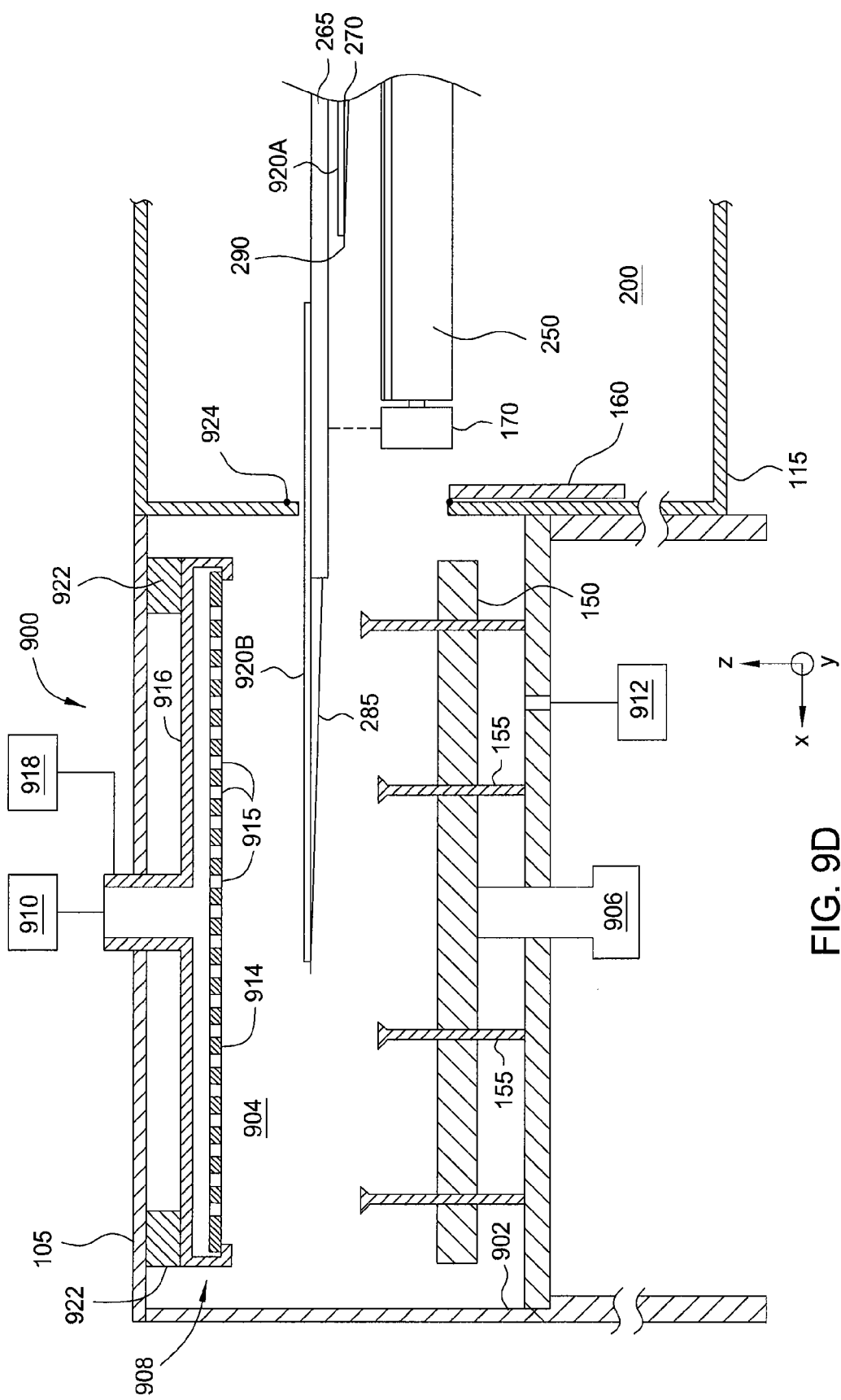
FIG. 9D is a schematic cross-sectional view of the plasma processing system of FIG. 9C showing a second substrate in a transfer position.
Figure 9E:
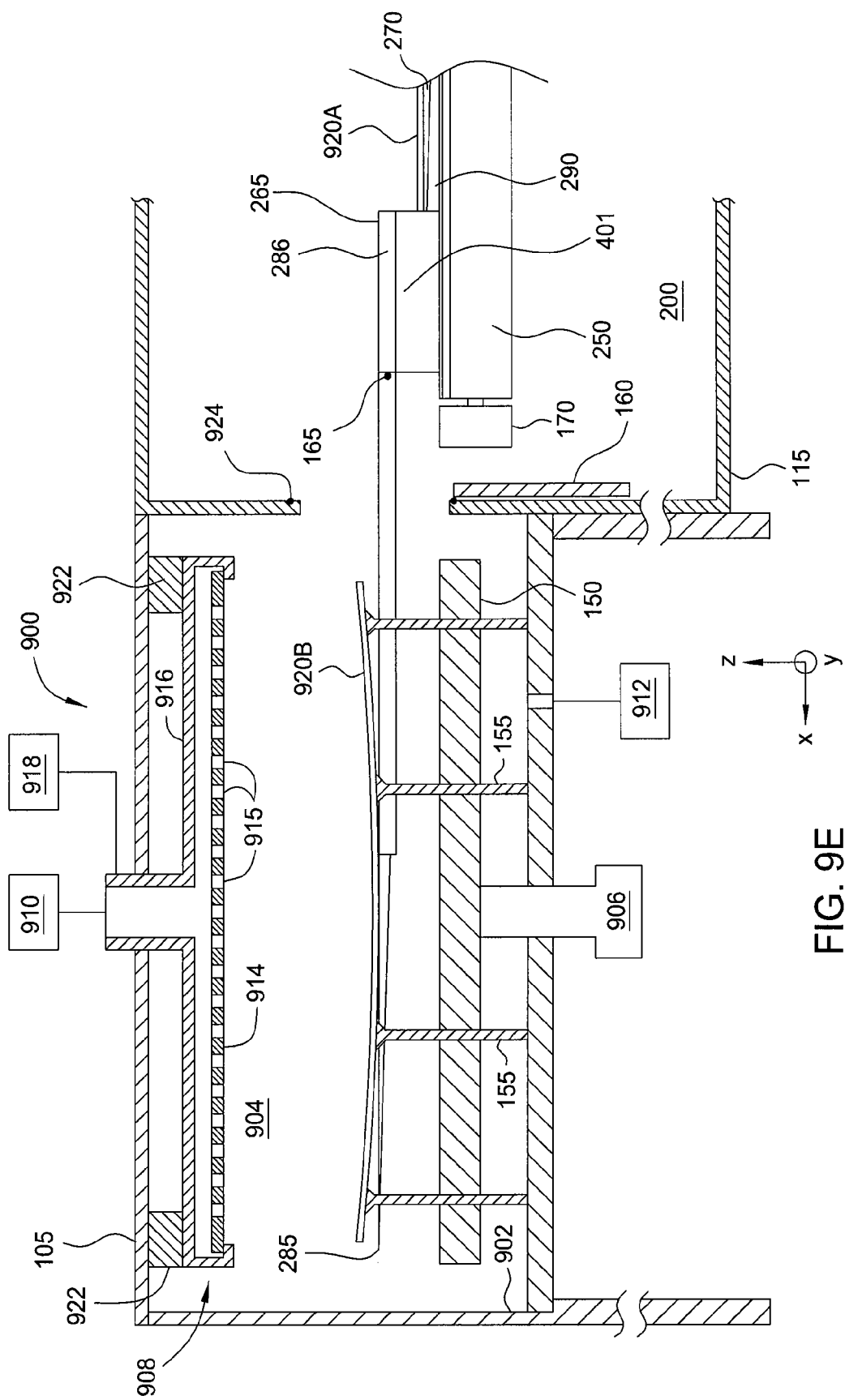
FIG. 9E is a schematic cross-sectional view of the plasma processing system 900 of FIG. 9D showing the second substrate supported on the lift pins above the substrate support.

FIG. 9D is a schematic cross-sectional view of the plasma processing system 900 showing a second substrate 920B supported on the fingers 285 of the upper end effector module 265. The upper end effector module 265 is adapted to move the second substrate 920B laterally (X direction) to a position above the lift pins 155 as shown in FIG. 9E. As the lower end effector module 270 is moving laterally (X direction) to remove the second substrate 920B, the image sensor 170 is scanning the second substrate 920B. Thus, defects in the second substrate 920B, as well as any previous deposition on the second substrate 920B, may be monitored in real time.

FIG. 9E is a schematic cross-sectional view of the plasma processing system 900 showing the second substrate 920B supported on the lift pins 155 above the substrate support 150. As the upper end effector module 265 enters the processing chamber 105, the image sensors 165 may view the processing volume 904, the sealing devices 924, as well as portions of the substrate support 150 and showerhead assembly 908. Images of the objects within the field of view of the image sensors 165 are provided to a user in order to assess the conditions within the transfer chamber 115 and/or the processing chamber 105. If conditions within the transfer chamber 115 and/or the processing chamber 105 are less than favorable, corrective action may be performed or scheduled for a later time. When the upper end effector module 265 exits the processing volume 904, the door 160 may be closed. The substrate support 150 may then be raised to a processing position as shown in FIG. 9A and a deposition process may begin on the second substrate 920B.

Embodiments described herein provide a transfer robot 125 capable of supporting and transferring at least two large area substrates in a processing system having a low pressure atmosphere. The transfer robot 125 includes a plurality of image sensors 165, 170 adapted to view the interior of the processing system and provide real-time images or video to a user. The real-time viewing of the interior of the processing system enables identification of potential problems in the processing of multiple substrates without having to open the various chambers. The image sensors 165 provide real-time monitoring of the interior chamber walls, the substrate support, the showerhead assembly, seals, edges of the large area substrate, as well as other portions of the end effector and portions of the system within the field of view of the sensors 165. This provides great advantages over the conventional systems which utilize view windows offering limited visual access and/or systems that require shutdown in order to inspect the interior of the chambers. Likewise, the image sensor 170 provides real-time viewing of the large area substrates during transfer as well as obtaining a metric of deposition uniformity on the large area substrate. The image sensor 170 provides data that may be utilized to tune process parameters used with subsequent large area substrates. This is an advantage over the conventional systems which typically require removal of the large area substrate to perform an inspection or metrology process. The image sensor 170 also provides viewing of the position of the large area substrate to prevent damage to the substrate and/or the system due to collisions. The transfer robot 125 having the image sensors 165 and 170 thus reduces downtime and maintenance costs while enhancing throughput.

While the foregoing is directed to embodiments of the present invention, other and further embodiments of the invention may be devised without departing from the basic scope thereof, and the scope thereof is determined by the claims that follow.

The invention claimed is:

1. A transfer robot for use in a vacuum environment, the transfer robot comprising:
 a lift assembly having a first drive assembly for moving a first platform relative to a second platform in a first linear direction;
 an end effector assembly disposed on the second platform and movable in a second linear direction by a second drive assembly, the second linear direction being orthogonal to the first linear direction, wherein the end effector assembly comprises two independently movable end effector modules;
 a plurality of hermetically sealed conduits movably coupled between the first platform and the second platform and coupled to the end effector assembly;
 a first image sensor coupled to the lift assembly in a position below the end effector modules, wherein the end effector modules are movable relative to the first image sensor; and
 a lighting device associated with the first image sensor.

2. The transfer robot of claim 1, further comprising a second image sensor that is coupled to and movable with the end effector assembly.

3. The transfer robot of claim 1, wherein the first image sensor is coupled to and movable with the second platform.

4. The transfer robot of claim 1, wherein the first image sensor comprises a hermetically sealed enclosure.

5. The transfer robot of claim 4, wherein the enclosure includes a plurality of fluid channels formed therein.

6. The transfer robot of claim 1, wherein the first image sensor comprises an actuator to move the image sensor relative to the transfer robot.

7. The transfer robot of claim 1, wherein the end effector assembly comprises a wrist and a plurality of fingers extending from the wrist, and a second image sensor is coupled to the wrist.

8. The transfer robot of claim 1, wherein each end effector module comprises a wrist and a plurality of fingers extending from the wrist.

9. The transfer robot of claim 8, wherein each of the end effector modules include a second image sensor.

10. The transfer robot of claim 1, wherein the first image sensor comprises a scanner.

11. The transfer robot of claim 1, wherein the first image sensor comprises a linear scanner sized to scan the entire width of a substrate disposed on the end effector assembly.

12. A transfer robot for use in a vacuum environment, comprising:
 a lift assembly comprising a first base rotatably coupled to a second base;
 a plurality of support members coupling the second base to a platform;
 a first drive assembly for moving the platform relative to the second base in a first linear direction;
 a plurality of hermetically sealed fluid conduits movably coupled between the second base and the platform with rotatable vacuum seals at points of movement of the plurality of support members;
 an end effector assembly disposed on the platform and movable in a second linear direction by a second drive assembly, the second linear direction being substantially orthogonal to the first linear direction; and
 a first image sensor coupled to one end of the platform in a position below the end effector assembly.

13. The transfer robot of claim 12, wherein the first image sensor is disposed in an enclosure.

14. The transfer robot of claim 13, wherein the enclosure includes a plurality of fluid channels disposed therein.

15. The transfer robot of claim 12, wherein the first image sensor is movable in a third linear direction, the third linear direction being substantially orthogonal to the first linear direction.

16. The transfer robot of claim 12, wherein a second image sensor is coupled to and movable with the end effector assembly.

17. The transfer robot of claim 12, wherein the end effector assembly comprises at least two stacked and independently movable end effector modules, each end effector module comprising a wrist and a plurality of fingers extending from the wrist.

18. The transfer robot of claim 17, wherein each of the end effector modules include a second image sensor.

19. The transfer robot of claim 12, wherein the plurality of support members further comprise:
 a first pair of support members having a first end rotatably coupled to the second base and a second end coupled to the platform by a first linear assembly; and a second pair of support members rotatably coupled to the platform and a second end coupled to the second base by a second linear assembly, the first pair and second pair of support members coupled together at a center thereof, and the first drive assembly provides a motive force to the plurality of support members to change the angle of the second pair of support members relative to the first pair of support members to move the platform in the first linear direction.

20. The transfer robot of claim 12, wherein the first image sensor comprises a scanner.

21. The transfer robot of claim 12, wherein the first image sensor comprises a linear scanner sized to scan the entire width of a substrate disposed on the end effector assembly.

22. A method for transferring a substrate from a transfer chamber to a processing chamber, the method comprising:
    providing a substrate on an end effector module disposed on a robot in the transfer chamber at vacuum pressures;
    transferring the substrate along a travel path through an opening between a processing chamber and the transfer chamber;
    viewing a lower surface of the substrate using an image sensor and lighting devices disposed on the robot as the substrate is transferred to the processing chamber; and
    flowing a coolant through hermetically sealed conduits disposed on the robot to maintain a temperature of the end effector module and the image sensor to be less than a temperature of the substrate.

23. The method of claim 22, wherein the image sensor is disposed in a housing having a pressure that is greater than a pressure in the transfer chamber.

24. The method of claim 22, wherein the image sensor is disposed in a housing that is in communication with a cooling fluid source.

* * * * *